US008723705B2

(12) United States Patent
Musfeldt

(10) Patent No.: US 8,723,705 B2
(45) Date of Patent: May 13, 2014

(54) LOW OUTPUT SKEW DOUBLE DATA RATE SERIAL ENCODER

(75) Inventor: Curtis Drew Musfeldt, Boulder, CO (US)

(73) Assignee: Qualcomm Incorporated, San Diego, CA (US)

( * ) Notice: Subject to any disclaimer, the term of this patent is extended or adjusted under 35 U.S.C. 154(b) by 88 days.

(21) Appl. No.: 11/463,129

(22) Filed: Aug. 8, 2006

(65) Prior Publication Data

US 2008/0036631 A1    Feb. 14, 2008

Related U.S. Application Data

(63) Continuation-in-part of application No. 11/285,397, filed on Nov. 23, 2005, now Pat. No. 7,315,265.

(60) Provisional application No. 60/630,853, filed on Nov. 24, 2004, provisional application No. 60/631,549, filed on Nov. 30, 2004, provisional application No. 60/632,825, filed on Dec. 2, 2004, provisional application No. 60/633,071, filed on Dec. 2, 2004, provisional application No. 60/633,084, filed on Dec. 2, 2004, provisional application No. 60/632,825, filed on Dec. 2, 2004.

(51) Int. Cl.
*H03M 9/00*    (2006.01)

(52) U.S. Cl.
USPC .......................................... 341/100; 341/101

(58) Field of Classification Search
USPC ............... 341/100, 101, 141; 370/535, 536; 375/371
See application file for complete search history.

(56) References Cited

U.S. PATENT DOCUMENTS

| 3,594,304 | A | 7/1971 | Seitzer |
|---|---|---|---|
| 4,042,783 | A | 8/1977 | Gindi |
| 4,363,123 | A | 12/1982 | Grover |
| 4,393,444 | A | 7/1983 | Weinberg |
| 4,491,943 | A | 1/1985 | Iga et al. |
| 4,660,096 | A | 4/1987 | Arlan et al. |
| 4,764,805 | A | 8/1988 | Rabbani et al. |
| 4,769,761 | A | 9/1988 | Downes et al. |
| 4,812,296 | A | 3/1989 | Schmelz et al. |

(Continued)

FOREIGN PATENT DOCUMENTS

| CN | 88101302 A | 10/1988 |
|---|---|---|
| CN | 1234709 A | 11/1999 |

(Continued)

OTHER PUBLICATIONS

Search Report, dated Nov. 8, 2006, for International Application No. PCT/US05/42415, 8 pages.

(Continued)

*Primary Examiner* — Peguy Jean Pierre
(74) *Attorney, Agent, or Firm* — S. Hossain Beladi

(57) ABSTRACT

A Double Data Rate (DDR) serial encoder is provided. In one aspect, the DDR serial encoder includes a non-glitchless multiplexer and digital logic for ensuring a glitch-free encoder output. By using a non-glitchless multiplexer, the size and complexity of the encoder is significantly reduced. In another aspect, the DDR serial encoder has a single layer of logic between the final register stage and the encoder output and a reduced number of paths from the final register stage to the encoder output, thereby resulting in reduced output skew and increased link rate.

42 Claims, 10 Drawing Sheets

(56) References Cited

U.S. PATENT DOCUMENTS

| | | | |
|---|---|---|---|
| 4,821,296 A * | 4/1989 | Cordell | 375/374 |
| 4,891,805 A | 1/1990 | Fallin | |
| 5,079,693 A | 1/1992 | Miller | |
| 5,111,455 A | 5/1992 | Negus | |
| 5,131,012 A | 7/1992 | Dravida | |
| 5,138,616 A | 8/1992 | Wagner, Jr. et al. | |
| 5,155,590 A | 10/1992 | Beyers, II et al. | |
| 5,167,035 A | 11/1992 | Mann et al. | |
| 5,224,213 A | 6/1993 | Dieffenderfer et al. | |
| 5,227,783 A | 7/1993 | Shaw et al. | |
| 5,231,636 A | 7/1993 | Rasmussen | |
| 5,331,642 A | 7/1994 | Valley et al. | |
| 5,345,542 A | 9/1994 | Wye | |
| 5,359,595 A | 10/1994 | Weddle et al. | |
| 5,377,188 A | 12/1994 | Seki | |
| 5,396,636 A | 3/1995 | Gallagher et al. | |
| 5,418,452 A | 5/1995 | Pyle | |
| 5,418,952 A | 5/1995 | Morley et al. | |
| 5,422,894 A | 6/1995 | Abe et al. | |
| 5,430,486 A | 7/1995 | Fraser et al. | |
| 5,477,534 A * | 12/1995 | Kusano | 370/286 |
| 5,483,185 A | 1/1996 | Scriber et al. | |
| 5,490,247 A | 2/1996 | Tung et al. | |
| 5,510,832 A | 4/1996 | Garcia | |
| 5,513,185 A | 4/1996 | Schmidt | |
| 5,519,830 A | 5/1996 | Opoczynski | |
| 5,521,907 A | 5/1996 | Ennis, Jr. et al. | |
| 5,524,007 A | 6/1996 | White et al. | |
| 5,530,704 A | 6/1996 | Gibbons et al. | |
| 5,535,336 A | 7/1996 | Smith et al. | |
| 5,543,939 A | 8/1996 | Harvey et al. | |
| 5,546,121 A | 8/1996 | Gotanda et al. | |
| 5,550,489 A | 8/1996 | Raab | |
| 5,559,459 A | 9/1996 | Back et al. | |
| 5,559,952 A | 9/1996 | Fujimoto | |
| 5,560,022 A | 9/1996 | Dunstan et al. | |
| 5,565,957 A | 10/1996 | Goto | |
| 5,575,951 A | 11/1996 | Anderson | |
| 5,604,450 A | 2/1997 | Borkar et al. | |
| 5,619,650 A | 4/1997 | Bach et al. | |
| 5,621,664 A | 4/1997 | Phaal | |
| 5,646,947 A | 7/1997 | Cooper et al. | |
| 5,664,948 A | 9/1997 | Dimitriadis et al. | |
| 5,680,404 A | 10/1997 | Gray | |
| 5,726,990 A * | 3/1998 | Shimada et al. | 370/536 |
| 5,732,352 A | 3/1998 | Gutowski et al. | |
| 5,733,131 A | 3/1998 | Park | |
| 5,751,445 A | 5/1998 | Masunaga | |
| 5,751,951 A | 5/1998 | Osborne et al. | |
| 5,777,999 A | 7/1998 | Hiraki et al. | |
| 5,790,551 A | 8/1998 | Chan | |
| 5,798,720 A | 8/1998 | Yano et al. | |
| 5,802,351 A | 9/1998 | Frampton | |
| 5,815,507 A | 9/1998 | Vinggaard et al. | |
| 5,816,921 A | 10/1998 | Hosokawa | |
| 5,818,255 A | 10/1998 | New et al. | |
| 5,822,603 A | 10/1998 | Hansen et al. | |
| 5,844,918 A | 12/1998 | Kato | |
| 5,847,752 A | 12/1998 | Sebestyen | |
| 5,862,160 A | 1/1999 | Irvin et al. | |
| 5,864,546 A | 1/1999 | Campanella | |
| 5,867,501 A | 2/1999 | Horst et al. | 370/474 |
| 5,867,510 A | 2/1999 | Steele | |
| 5,881,262 A | 3/1999 | Abramson et al. | |
| 5,903,281 A | 5/1999 | Chen et al. | |
| 5,935,256 A | 8/1999 | Lesmeister | |
| 5,953,378 A | 9/1999 | Hotani et al. | |
| 5,958,006 A | 9/1999 | Eggleston et al. | |
| 5,963,557 A | 10/1999 | Eng | |
| 5,963,564 A | 10/1999 | Petersen et al. | |
| 5,963,979 A | 10/1999 | Inoue | |
| 5,969,750 A | 10/1999 | Hsieh et al. | |
| 5,982,362 A | 11/1999 | Crater et al. | |
| 5,983,261 A | 11/1999 | Riddle | |
| 5,990,852 A | 11/1999 | Szamrej | |
| 5,990,902 A | 11/1999 | Park | |
| 5,995,512 A | 11/1999 | Pogue, Jr. | |
| 6,002,709 A | 12/1999 | Hendrickson | |
| 6,014,705 A | 1/2000 | Koenck et al. | |
| 6,047,380 A | 4/2000 | Nolan et al. | |
| 6,049,837 A | 4/2000 | Youngman | |
| 6,055,247 A | 4/2000 | Kubota et al. | |
| 6,064,649 A | 5/2000 | Johnston | |
| 6,078,361 A | 6/2000 | Reddy | |
| 6,081,513 A | 6/2000 | Roy | |
| 6,091,709 A | 7/2000 | Harrison et al. | |
| 6,092,231 A | 7/2000 | Sze | |
| 6,097,401 A | 8/2000 | Owen et al. | |
| 6,101,601 A | 8/2000 | Matthews et al. | |
| 6,117,681 A | 9/2000 | Salmons et al. | |
| 6,118,791 A | 9/2000 | Fichou et al. | |
| 6,151,067 A | 11/2000 | Suemoto et al. | |
| 6,151,320 A | 11/2000 | Shim et al. | |
| 6,154,156 A | 11/2000 | Tagato | |
| 6,154,466 A | 11/2000 | Iwasaki et al. | |
| 6,185,601 B1 | 2/2001 | Wolff | |
| 6,192,230 B1 | 2/2001 | Van Bokhorst et al. | |
| 6,198,752 B1 | 3/2001 | Lee | |
| 6,199,169 B1 | 3/2001 | Voth | |
| 6,222,677 B1 | 4/2001 | Budd et al. | |
| 6,236,647 B1 | 5/2001 | Amalfitano | |
| 6,242,953 B1 * | 6/2001 | Thomas | 327/115 |
| 6,243,596 B1 | 6/2001 | Kikinis | |
| 6,243,761 B1 | 6/2001 | Mogul et al. | |
| 6,246,876 B1 | 6/2001 | Hontzeas | |
| 6,252,526 B1 | 6/2001 | Uyehara | |
| 6,256,509 B1 | 7/2001 | Tanaka et al. | |
| 6,288,739 B1 | 9/2001 | Hales et al. | |
| 6,297,684 B1 | 10/2001 | Uyehara et al. | |
| 6,308,239 B1 | 10/2001 | Osakada et al. | |
| 6,335,696 B1 | 1/2002 | Aoyagi et al. | |
| 6,359,479 B1 | 3/2002 | Oprescu | |
| 6,363,439 B1 | 3/2002 | Battles et al. | |
| 6,393,008 B1 | 5/2002 | Cheng et al. | |
| 6,397,286 B1 * | 5/2002 | Chatenever et al. | 710/302 |
| 6,400,392 B1 | 6/2002 | Yamaguchi et al. | |
| 6,400,654 B1 | 6/2002 | Sawamura et al. | |
| 6,400,754 B2 | 6/2002 | Fleming et al. | |
| 6,421,735 B1 | 7/2002 | Jung et al. | |
| 6,429,867 B1 | 8/2002 | Deering | |
| 6,430,196 B1 | 8/2002 | Baroudi | |
| 6,430,606 B1 | 8/2002 | Haq | |
| 6,434,187 B1 | 8/2002 | Beard et al. | |
| 6,438,363 B1 | 8/2002 | Feder et al. | |
| 6,457,090 B1 | 9/2002 | Young | |
| 6,475,245 B2 | 11/2002 | Gersho et al. | |
| 6,480,521 B1 | 11/2002 | Odenwalder et al. | |
| 6,483,825 B2 | 11/2002 | Seta | |
| 6,487,217 B1 | 11/2002 | Baroudi | |
| 6,493,357 B1 | 12/2002 | Fujisaki | |
| 6,493,713 B1 | 12/2002 | Kanno | |
| 6,493,824 B1 | 12/2002 | Novoa et al. | |
| 6,545,979 B1 | 4/2003 | Poulin | |
| 6,549,538 B1 | 4/2003 | Beck et al. | |
| 6,549,958 B1 | 4/2003 | Kuba | |
| 6,574,211 B2 | 6/2003 | Padovani et al. | |
| 6,583,809 B1 | 6/2003 | Fujiwara | |
| 6,594,304 B2 | 7/2003 | Chan | |
| 6,609,167 B1 | 8/2003 | Bastiani et al. | |
| 6,611,221 B1 | 8/2003 | Soundarapandian et al. | |
| 6,611,503 B1 | 8/2003 | Fitzgerald et al. | |
| 6,618,360 B1 | 9/2003 | Scoville et al. | |
| 6,621,809 B1 | 9/2003 | Lee et al. | |
| 6,621,851 B1 | 9/2003 | Agee et al. | |
| 6,636,508 B1 | 10/2003 | Li et al. | |
| 6,636,922 B1 | 10/2003 | Bastiani et al. | |
| 6,662,322 B1 | 12/2003 | Abdelilah et al. | |
| 6,690,201 B1 | 2/2004 | Simkins et al. | |
| 6,714,233 B2 | 3/2004 | Chihara et al. | |
| 6,715,088 B1 | 3/2004 | Togawa | |
| 6,728,263 B2 | 4/2004 | Joy et al. | |
| 6,738,344 B1 | 5/2004 | Bunton et al. | |
| 6,745,364 B2 | 6/2004 | Bhatt et al. | |
| 6,754,179 B1 | 6/2004 | Lin | |

(56) References Cited

U.S. PATENT DOCUMENTS

| | | |
|---|---|---|
| 6,760,722 B1 | 7/2004 | Raghunandan |
| 6,760,772 B2 | 7/2004 | Zou et al. ............... 709/230 |
| 6,760,882 B1 | 7/2004 | Gesbert et al. |
| 6,765,506 B1 | 7/2004 | Lu |
| 6,771,613 B1 | 8/2004 | O'Toole et al. |
| 6,778,493 B1 | 8/2004 | Ishii |
| 6,782,039 B2 | 8/2004 | Alamouti et al. |
| 6,784,941 B1 | 8/2004 | Su et al. |
| 6,791,379 B1 | 9/2004 | Wakayama et al. |
| 6,797,891 B1 | 9/2004 | Blair et al. |
| 6,804,257 B1 | 10/2004 | Benayoun et al. |
| 6,810,084 B1 * | 10/2004 | Jun et al. ............... 375/240.28 |
| 6,813,638 B1 | 11/2004 | Sevanto et al. |
| 6,816,929 B2 | 11/2004 | Ueda |
| 6,831,685 B1 | 12/2004 | Ueno et al. |
| 6,836,469 B1 | 12/2004 | Wu |
| 6,850,282 B1 | 2/2005 | Makino et al. |
| 6,865,240 B1 | 3/2005 | Kawataka |
| 6,865,609 B1 | 3/2005 | Gubbi et al. |
| 6,865,610 B2 | 3/2005 | Bolosky et al. |
| 6,867,668 B1 | 3/2005 | Dagostino et al. |
| 6,882,361 B1 | 4/2005 | Gaylord |
| 6,886,035 B2 | 4/2005 | Wolff |
| 6,892,071 B2 | 5/2005 | Park |
| 6,894,994 B1 | 5/2005 | Grob et al. |
| 6,895,410 B2 | 5/2005 | Ridge |
| 6,897,891 B2 | 5/2005 | Itsukaichi |
| 6,906,762 B1 | 6/2005 | Witehira |
| 6,927,746 B2 | 8/2005 | Lee et al. |
| 6,944,136 B2 | 9/2005 | Kim et al. |
| 6,947,436 B2 | 9/2005 | Harris et al. |
| 6,950,428 B1 | 9/2005 | Horst et al. |
| 6,956,829 B2 | 10/2005 | Lee et al. |
| 6,973,039 B2 | 12/2005 | Redi et al. |
| 6,973,062 B1 | 12/2005 | Han |
| 6,975,145 B1 | 12/2005 | Vadi et al. |
| 6,990,549 B2 | 1/2006 | Main et al. |
| 6,993,393 B2 | 1/2006 | Von Arx et al. |
| 6,999,432 B2 | 2/2006 | Zhang et al. |
| 7,003,796 B1 | 2/2006 | Humpleman |
| 7,010,607 B1 | 3/2006 | Bunton |
| 7,012,636 B2 | 3/2006 | Hatanaka |
| 7,015,838 B1 * | 3/2006 | Groen et al. ............... 341/100 |
| 7,030,796 B2 | 4/2006 | Shim et al. |
| 7,036,066 B2 | 4/2006 | Weibel et al. |
| 7,042,914 B2 | 5/2006 | Zerbe et al. |
| 7,047,475 B2 | 5/2006 | Sharma et al. |
| 7,051,218 B1 | 5/2006 | Gulick et al. |
| 7,062,264 B2 | 6/2006 | Ko et al. |
| 7,062,579 B2 | 6/2006 | Tateyama et al. |
| 7,068,666 B2 | 6/2006 | Foster et al. |
| 7,095,435 B1 | 8/2006 | Hartman et al. |
| 7,110,420 B2 | 9/2006 | Bashirullah et al. |
| 7,126,945 B2 | 10/2006 | Beach |
| 7,138,989 B2 | 11/2006 | Mendelson et al. |
| 7,143,177 B1 | 11/2006 | Johnson et al. |
| 7,143,207 B2 | 11/2006 | Vogt et al. |
| 7,145,411 B1 | 12/2006 | Blair et al. |
| 7,151,940 B2 | 12/2006 | Diao |
| 7,158,536 B2 | 1/2007 | Ching et al. |
| 7,158,539 B2 | 1/2007 | Zhang et al. |
| 7,161,846 B2 * | 1/2007 | Padaparambil ............ 365/189.05 |
| 7,165,112 B2 | 1/2007 | Battin et al. |
| 7,178,042 B2 | 2/2007 | Sakagami |
| 7,180,951 B2 | 2/2007 | Chan |
| 7,184,408 B2 | 2/2007 | Denton et al. |
| 7,187,738 B2 | 3/2007 | Naven et al. |
| 7,191,281 B2 | 3/2007 | Bajikar |
| 7,219,294 B2 | 5/2007 | Vogt et al. |
| 7,231,402 B2 | 6/2007 | Dickens |
| 7,251,231 B2 | 7/2007 | Gubbi |
| 7,257,087 B2 | 8/2007 | Grovenburg |
| 7,260,087 B2 | 8/2007 | Bao et al. |
| 7,269,153 B1 | 9/2007 | Schultz et al. |
| 7,274,652 B1 | 9/2007 | Webster et al. |
| 7,278,069 B2 | 10/2007 | Abrosimov et al. |
| 7,284,181 B1 | 10/2007 | Venkatramani |
| 7,301,968 B2 | 11/2007 | Haran et al. |
| 7,310,535 B1 | 12/2007 | MacKenzie et al. |
| 7,315,265 B2 | 1/2008 | Wiley et al. |
| 7,315,520 B2 | 1/2008 | Xue et al. |
| 7,317,754 B1 | 1/2008 | Remy et al. |
| 7,327,735 B2 | 2/2008 | Robotham et al. |
| 7,336,139 B2 | 2/2008 | Blair et al. |
| 7,336,667 B2 | 2/2008 | Allen et al. |
| 7,340,548 B2 | 3/2008 | Love et al. |
| 7,349,973 B2 | 3/2008 | Saito et al. |
| 7,373,155 B2 | 5/2008 | Duan et al. |
| 7,383,350 B1 | 6/2008 | Moore et al. |
| 7,383,399 B2 | 6/2008 | Vogt et al. |
| 7,392,541 B2 | 6/2008 | Largman et al. |
| 7,403,511 B2 | 7/2008 | Liang et al. |
| 7,405,703 B2 | 7/2008 | Qi et al. |
| 7,412,642 B2 | 8/2008 | Cypher |
| 7,430,001 B2 | 9/2008 | Fujii |
| 7,447,953 B2 | 11/2008 | Vogt et al. |
| 7,451,362 B2 | 11/2008 | Chen et al. |
| 7,487,917 B2 | 2/2009 | Kotlarsky et al. |
| 7,508,760 B2 | 3/2009 | Akiyama et al. |
| 7,515,705 B2 | 4/2009 | Segawa et al. |
| 7,526,323 B2 | 4/2009 | Kim et al. |
| 7,536,598 B2 | 5/2009 | Largman et al. |
| 7,543,326 B2 | 6/2009 | Moni |
| 7,557,633 B2 | 7/2009 | Yu |
| 7,574,113 B2 | 8/2009 | Nagahara et al. |
| 7,595,834 B2 | 9/2009 | Kawai et al. |
| 7,595,835 B2 | 9/2009 | Kosaka et al. |
| 7,729,720 B2 | 6/2010 | Suh et al. |
| 7,800,600 B2 | 9/2010 | Komatsu et al. |
| 7,844,296 B2 | 11/2010 | Yuki |
| 7,873,343 B2 | 1/2011 | Gollnick et al. |
| 7,876,821 B2 | 1/2011 | Li et al. |
| 7,912,503 B2 | 3/2011 | Chang et al. |
| 8,031,130 B2 | 10/2011 | Tamura |
| 8,077,634 B2 | 12/2011 | Maggenti et al. |
| 8,325,239 B2 | 12/2012 | Kaplan et al. |
| 2001/0005385 A1 | 6/2001 | Ichiguchi et al. |
| 2001/0012293 A1 | 8/2001 | Peterson et al. |
| 2001/0047450 A1 | 11/2001 | Gillingham et al. |
| 2001/0047475 A1 | 11/2001 | Terasaki |
| 2001/0053174 A1 | 12/2001 | Fleming et al. |
| 2002/0011998 A1 | 1/2002 | Tamura |
| 2002/0045448 A1 | 4/2002 | Park et al. |
| 2002/0071395 A1 | 6/2002 | Redi et al. |
| 2002/0131379 A1 | 9/2002 | Lee et al. |
| 2002/0140845 A1 | 10/2002 | Yoshida et al. |
| 2002/0146024 A1 | 10/2002 | Harris et al. |
| 2002/0188907 A1 | 12/2002 | Kobayashi |
| 2002/0193133 A1 | 12/2002 | Shibutani |
| 2003/0003943 A1 | 1/2003 | Bajikar et al. |
| 2003/0028647 A1 | 2/2003 | Grosu |
| 2003/0033417 A1 | 2/2003 | Wiley et al. |
| 2003/0035049 A1 | 2/2003 | Dickens et al. |
| 2003/0039212 A1 | 2/2003 | Lloyd et al. |
| 2003/0061431 A1 | 3/2003 | Mears et al. |
| 2003/0081557 A1 | 5/2003 | Mettala et al. |
| 2003/0086443 A1 | 5/2003 | Beach et al. |
| 2003/0091056 A1 | 5/2003 | Walker et al. |
| 2003/0093607 A1 | 5/2003 | Main et al. |
| 2003/0125040 A1 | 7/2003 | Walton et al. |
| 2003/0144006 A1 | 7/2003 | Johansson et al. |
| 2003/0158979 A1 | 8/2003 | Tateyama et al. |
| 2003/0185220 A1 | 10/2003 | Valenci |
| 2003/0191809 A1 | 10/2003 | Mosley et al. |
| 2003/0194018 A1 | 10/2003 | Chang |
| 2003/0235209 A1 | 12/2003 | Garg et al. |
| 2004/0008631 A1 | 1/2004 | Kim |
| 2004/0024920 A1 | 2/2004 | Gulick et al. |
| 2004/0028415 A1 | 2/2004 | Eiselt |
| 2004/0049616 A1 | 3/2004 | Dunstan et al. |
| 2004/0073697 A1 | 4/2004 | Saito et al. ............... 709/233 |
| 2004/0082383 A1 | 4/2004 | Muncaster et al. |
| 2004/0100966 A1 | 5/2004 | Allen, Jr. et al. |
| 2004/0128563 A1 | 7/2004 | Kaushik et al. |

(56) References Cited

U.S. PATENT DOCUMENTS

| | | |
|---|---|---|
| 2004/0130466 A1 | 7/2004 | Lu et al. |
| 2004/0140459 A1 | 7/2004 | Haigh et al. ............... 252/501.1 |
| 2004/0153952 A1 | 8/2004 | Sharma et al. |
| 2004/0176065 A1 | 9/2004 | Liu |
| 2004/0184450 A1 | 9/2004 | Omran |
| 2004/0199652 A1 | 10/2004 | Zou et al. |
| 2004/0221315 A1 | 11/2004 | Kobayashi |
| 2004/0260823 A1 | 12/2004 | Tiwari et al. |
| 2005/0012905 A1 | 1/2005 | Morinaga |
| 2005/0020279 A1 | 1/2005 | Markhovsky et al. |
| 2005/0021885 A1 | 1/2005 | Anderson et al. |
| 2005/0033586 A1 | 2/2005 | Savell |
| 2005/0088939 A1 | 4/2005 | Hwang et al. |
| 2005/0091593 A1 | 4/2005 | Peltz |
| 2005/0108611 A1 | 5/2005 | Vogt et al. |
| 2005/0117601 A1 | 6/2005 | Anderson et al. |
| 2005/0120079 A1 | 6/2005 | Anderson et al. |
| 2005/0120208 A1 | 6/2005 | Dobson et al. |
| 2005/0125840 A1 | 6/2005 | Anderson et al. |
| 2005/0135390 A1 | 6/2005 | Anderson et al. |
| 2005/0138260 A1 | 6/2005 | Love et al. |
| 2005/0144225 A1 | 6/2005 | Anderson et al. |
| 2005/0154599 A1 | 7/2005 | Kopra et al. |
| 2005/0163085 A1 | 7/2005 | Cromer et al. |
| 2005/0163116 A1 | 7/2005 | Anderson et al. |
| 2005/0165970 A1 | 7/2005 | Ching et al. .................... 705/64 |
| 2005/0184993 A1 | 8/2005 | Ludwin et al. |
| 2005/0204057 A1 | 9/2005 | Anderson et al. |
| 2005/0213593 A1 | 9/2005 | Anderson et al. |
| 2005/0216421 A1 | 9/2005 | Barry et al. .................... 705/64 |
| 2005/0216599 A1 | 9/2005 | Anderson et al. |
| 2005/0216623 A1 | 9/2005 | Dietrich et al. |
| 2005/0248685 A1 | 11/2005 | Seo et al. ....................... 348/376 |
| 2005/0259670 A1 | 11/2005 | Anderson et al. |
| 2005/0265333 A1 | 12/2005 | Coffey et al. |
| 2005/0271072 A1 | 12/2005 | Anderson et al. |
| 2005/0286466 A1 | 12/2005 | Tagg et al. |
| 2006/0004968 A1 | 1/2006 | Vogt et al. |
| 2006/0034301 A1 | 2/2006 | Anderson et al. |
| 2006/0034326 A1 | 2/2006 | Anderson et al. |
| 2006/0120433 A1 | 6/2006 | Baker et al. |
| 2006/0128399 A1 | 6/2006 | Duan et al. |
| 2006/0161691 A1 | 7/2006 | Katibian et al. |
| 2006/0164424 A1 | 7/2006 | Wiley et al. |
| 2006/0168496 A1 | 7/2006 | Steele et al. |
| 2006/0171414 A1 | 8/2006 | Katibian et al. |
| 2006/0179164 A1 | 8/2006 | Katibian et al. |
| 2006/0179384 A1 | 8/2006 | Wiley et al. |
| 2006/0212775 A1 | 9/2006 | Cypher et al. |
| 2006/0274031 A1 | 12/2006 | Yuen et al. |
| 2006/0288133 A1 | 12/2006 | Katibian et al. |
| 2007/0008897 A1 | 1/2007 | Denton et al. |
| 2007/0073949 A1 | 3/2007 | Fredrickson et al. |
| 2007/0274434 A1 | 11/2007 | Arkas et al. |
| 2008/0088492 A1 | 4/2008 | Wiley et al. |
| 2008/0129749 A1 | 6/2008 | Wiley et al. |
| 2008/0147951 A1 | 6/2008 | Love |
| 2008/0282296 A1 | 11/2008 | Kawai et al. |
| 2009/0055709 A1 | 2/2009 | Anderson et al. |
| 2009/0070479 A1 | 3/2009 | Anderson et al. |
| 2009/0290628 A1 | 11/2009 | Matsumoto |
| 2010/0128626 A1 | 5/2010 | Anderson et al. |
| 2010/0260055 A1 | 10/2010 | Anderson et al. |
| 2011/0013681 A1 | 1/2011 | Zou et al. |
| 2011/0022719 A1 | 1/2011 | Anderson et al. |
| 2011/0199383 A1 | 8/2011 | Anderson et al. |
| 2011/0199931 A1 | 8/2011 | Anderson et al. |
| 2012/0008642 A1 | 1/2012 | Katibian et al. |

FOREIGN PATENT DOCUMENTS

| | | |
|---|---|---|
| CN | 1310400 A | 8/2001 |
| CN | 1377194 A | 10/2002 |
| CN | 1467953 A | 1/2004 |
| CN | 1476268 A | 2/2004 |
| EP | 0594006 A1 | 4/1994 |
| EP | 0872085 | 12/1996 |
| EP | 0850522 A2 | 7/1998 |
| EP | 0896318 | 2/1999 |
| EP | 0969676 | 1/2000 |
| EP | 1217602 A2 | 6/2002 |
| EP | 1309151 | 5/2003 |
| EP | 1423778 A2 | 6/2004 |
| EP | 1478137 A1 | 11/2004 |
| EP | 1544743 A2 | 6/2005 |
| EP | 1580964 A1 | 9/2005 |
| EP | 1630784 | 3/2006 |
| FR | 2729528 A1 | 7/1996 |
| GB | 2250668 A | 6/1992 |
| GB | 2265796 | 10/1993 |
| JP | 53131709 A | 11/1978 |
| JP | 62132433 A | 6/1987 |
| JP | 64008731 U | 1/1989 |
| JP | 1314022 A | 12/1989 |
| JP | 4167715 A | 6/1992 |
| JP | 4241541 | 8/1992 |
| JP | 5199387 A | 8/1993 |
| JP | 5219141 A | 8/1993 |
| JP | 5260115 A | 10/1993 |
| JP | 6037848 A | 2/1994 |
| JP | 06053973 | 2/1994 |
| JP | 06317829 | 11/1994 |
| JP | 7115352 A | 5/1995 |
| JP | 837490 | 2/1996 |
| JP | H0854481 A | 2/1996 |
| JP | 08-274799 | 10/1996 |
| JP | 09-006725 | 1/1997 |
| JP | 09230837 | 9/1997 |
| JP | 09261232 | 10/1997 |
| JP | 9270951 A | 10/1997 |
| JP | 9307457 A | 11/1997 |
| JP | 10234038 | 2/1998 |
| JP | 10200941 | 7/1998 |
| JP | 10312370 A | 11/1998 |
| JP | 1117710 | 1/1999 |
| JP | 11032041 | 2/1999 |
| JP | 11122234 A | 4/1999 |
| JP | 11163690 A | 6/1999 |
| JP | 11225182 A | 8/1999 |
| JP | 11225372 A | 8/1999 |
| JP | 11249987 | 9/1999 |
| JP | 11282786 A | 10/1999 |
| JP | 11341363 A | 12/1999 |
| JP | 11355327 A | 12/1999 |
| JP | 2000188626 | 7/2000 |
| JP | 2000216843 A | 8/2000 |
| JP | 2000236260 | 8/2000 |
| JP | 2000278141 A | 10/2000 |
| JP | 2000295667 | 10/2000 |
| JP | 200324135 A | 11/2000 |
| JP | 2000358033 A | 12/2000 |
| JP | 200144960 | 2/2001 |
| JP | 200194542 | 4/2001 |
| JP | 2001094524 | 4/2001 |
| JP | 2001177746 | 6/2001 |
| JP | 2001222474 A | 8/2001 |
| JP | 2001282714 A | 10/2001 |
| JP | 2001292146 A | 10/2001 |
| JP | 2001306428 | 11/2001 |
| JP | 2001319745 A | 11/2001 |
| JP | 2001320280 | 11/2001 |
| JP | 2001333130 A | 11/2001 |
| JP | 2002500855 A | 1/2002 |
| JP | 2002503065 T | 1/2002 |
| JP | 2002062990 A | 2/2002 |
| JP | 2002208844 A | 7/2002 |
| JP | 2002281007 A | 9/2002 |
| JP | 2002300229 A | 10/2002 |
| JP | 2002300299 A | 10/2002 |
| JP | 2003006143 A | 1/2003 |
| JP | 2003009035 A | 1/2003 |
| JP | 2003044184 A | 2/2003 |
| JP | 2003046595 | 2/2003 |

(56) References Cited

FOREIGN PATENT DOCUMENTS

| | | |
|---|---|---|
| JP | 2003046596 A | 2/2003 |
| JP | 2003058271 A | 2/2003 |
| JP | 2003069544 A | 3/2003 |
| JP | 2003076654 A | 3/2003 |
| JP | 2003098583 A | 4/2003 |
| JP | 2003111135 | 4/2003 |
| JP | 2003167680 | 6/2003 |
| JP | 2003198550 A | 7/2003 |
| JP | 2004005683 A | 1/2004 |
| JP | 2004007356 A | 1/2004 |
| JP | 2004021613 | 1/2004 |
| JP | 2004046324 A | 2/2004 |
| JP | 2004153620 | 5/2004 |
| JP | 2004246023 A | 9/2004 |
| JP | 2004297660 A | 10/2004 |
| JP | 2004531916 | 10/2004 |
| JP | 2004309623 A | 11/2004 |
| JP | 2004363687 A | 12/2004 |
| JP | 20058107683 A | 4/2005 |
| JP | 2005536167 A | 11/2005 |
| JP | 2005539464 A | 12/2005 |
| JP | 2008522493 | 6/2008 |
| KR | 199961245 | 7/1999 |
| KR | 0222225 | 10/1999 |
| KR | 1019990082741 | 11/1999 |
| KR | 200039224 | 7/2000 |
| KR | 1999-0058829 | 1/2001 |
| KR | 20010019734 | 3/2001 |
| KR | 20020071226 | 9/2002 |
| KR | 2003-0061001 | 7/2003 |
| KR | 2004-0014406 | 2/2004 |
| KR | 1020047003852 | 5/2004 |
| KR | 2004-69360 | 8/2004 |
| KR | 1020060053050 | 5/2006 |
| KR | 1020060056989 | 5/2006 |
| RU | 2111619 | 5/1998 |
| RU | 2150791 | 6/2000 |
| RU | 2337497 | 10/2008 |
| RU | 2337497 C2 | 10/2008 |
| TW | 459184 B | 10/2001 |
| TW | 466410 | 12/2001 |
| TW | 488133 B | 5/2002 |
| TW | 5507195 | 10/2002 |
| TW | 513636 | 12/2002 |
| TW | 515154 | 12/2002 |
| TW | 529253 | 4/2003 |
| TW | 535372 | 6/2003 |
| TW | 540238 B | 7/2003 |
| TW | 542979 B | 7/2003 |
| TW | 200302008 | 7/2003 |
| TW | 546958 | 8/2003 |
| TW | 552792 B | 9/2003 |
| TW | 200304313 | 9/2003 |
| TW | 563305 B | 11/2003 |
| TW | 569547 B | 1/2004 |
| TW | 595116 B | 6/2004 |
| WO | 9210890 | 6/1992 |
| WO | 9410779 | 5/1994 |
| WO | 9619053 | 6/1996 |
| WO | 1996/42158 A1 | 12/1996 |
| WO | 96042158 | 12/1996 |
| WO | 1998/02988 A2 | 1/1998 |
| WO | WO9915979 | 4/1999 |
| WO | 9923783 A2 | 5/1999 |
| WO | 0130038 | 4/2001 |
| WO | 0138970 | 5/2001 |
| WO | WO0137484 A2 | 5/2001 |
| WO | WO0138982 | 5/2001 |
| WO | WO 0158162 | 8/2001 |
| WO | 200249314 A1 | 6/2002 |
| WO | WO02098112 A2 | 12/2002 |
| WO | 2003023587 A2 | 3/2003 |
| WO | 03039081 | 5/2003 |
| WO | 03040893 | 5/2003 |
| WO | 03061240 | 7/2003 |
| WO | WO2004015680 | 2/2004 |
| WO | 2004110021 | 12/2004 |
| WO | 2005018191 | 2/2005 |
| WO | 2005073955 A1 | 8/2005 |
| WO | 2005088939 | 9/2005 |
| WO | 2005091593 | 9/2005 |
| WO | 2005096594 | 10/2005 |
| WO | 2005122509 | 12/2005 |
| WO | WO2006008067 | 1/2006 |
| WO | 2006058045 | 6/2006 |
| WO | 2006058050 | 6/2006 |
| WO | 2006058051 | 6/2006 |
| WO | 2006058052 | 6/2006 |
| WO | 2006058053 | 6/2006 |
| WO | 2006058067 | 6/2006 |
| WO | 2006058173 | 6/2006 |
| WO | WO2006058045 A2 | 6/2006 |
| WO | WO2006058051 | 6/2006 |
| WO | WO2007051186 | 5/2007 |

OTHER PUBLICATIONS

Video Electronics Standards Association (VESA), "Mobile Display Digital Interface Standard (MDDI)", Jul. 2004.
Plug and Display Standard, Video Electronics Standards Association (VESA) San Jose, CA (Jun. 11, 1997).
International Search Report—PCT/US07/075127—International Search Authority—European Patent Office—Jan. 3, 2008.
J. Sevanto, "Multimedia messaging service for GPRS and UMTS", IEEE on WCNC, Sep. 1999, pp. 1422-1426, vol. 3.
"V4400," Product Brochure, May 31, 2004.
"Transmission and Multiplexing; High Bit Rate Digital Subscriber Line (HDSL) Transmission System on Metallic Local Lines; HDSL Core Specification and Applications for 2 048 Kbit/S Based Acess Digital Sections; ETR 152" European Telecommunications Standard Dec. 1996.
IEEE STD 1394B; IEEE Standard for High Performance Serial Bus-Amendment 2(Dec. 2002).
Written Opinion—PCT/US07/075127—International search Authority—European Patent Office—Jan. 3, 2008.
Internationai Preiirninaty Report on Patentability—PCT/US07/075127—The International Bureau of WIPO—Geneva, Switzerland—Feb. 10, 2009.
VESA Mobile Display Digital Interface, Proposed Standard: Version 1P, Draft 10, Aug. 13,2003, pp. 1-75.
VESA Mobile Display Digital Interface, Proposed Standard, Version 1 p. Draft 1 0, Aug. 13, 2003. pp. 76-151.
VESA Mobile Display Digital Interface, Proposed Standard; Version 1 p. Draft 11. Sep. 10, 2003, pp. 1-75.
VESA Mobile Display Digital Interface, Proposed Standard; Version 1 p. Draft 11. Sep. 10, 2003, pp. 76-150.
VESA Mobile Display Digital Interface, Proposed Standard; Version 1 p, Draft 13, Oct. 15, 2003, pp. 1-75.
VESA Mobile Display Digital Interface, Proposed Standard: Version 1P, Draft 13, Oct. 15, 003. Pages 76-154.
VESA Mobile Display Digital Interface, Proposed Standard: Version1P. Draft 14 "Oct. 29, 2003"pp. 1-75.
VESA Mobile Display Digitai Interface, Proposed Standard, Version 1P, Draft 14, Oct. 29, 2003, pp. 7-158.
VESA Mobiie Display Digital Interface, Proposed Standard: Verson 1P, Draft 15, Nov. 12, 2003, pp. 1-75.
VESA Mobile Display Digital Interface, Proposed Standard: Version 1P, Draft 15, Nov. 12, 2003, pp. 76-160.
Liptak, "Instrument Engineer's Handbook, Third Edition, Volume Three: Process Software and Digital Networks, Section 4.17, Proprietary Networks, pp. 627-637. Boca Raton"CRC Press, Jun. 26, 2002.
IEEE Transactions on Information Theory, Vol., IT-3, No. 4, Burt Masnick et al., Oct. 1967, on Linear Unequal Error Protection Codes.
Hopkins, K. et al.: "Display Power Management," IP.Com Journal; IP.com Inc., West Henrietta, NY (Mar. 1, 1995), XP013103130, ISSN: 1533-0001, vol. 38 No. 3 pp. 425-427.
STMicroelectronics: "STV0974 Mobile Imaging DSP Rev.3", Datasheet internet 30.

(56) References Cited

OTHER PUBLICATIONS

Nov. 30, 2004, XP002619368, Retrieved from the Internet: URL:http://pdf1.alldatasheet.comIdatasheet-pdf/view/112376/ STMICROELECTRONICS/STV0974.html [retrieved on Jan. 27, 2011].

Supplementary European Search Report—EP05849651, Search Authority—The Hague Patent Office, Jan. 31, 2011.

"Universal Serial Bus Specification—Revision 2.0: Chapter 9—USB Device Framework," Universal Serial Bus Specification, Apr. 27, 2000, pp. 239-274, XP002474828.

VESA: VESA Mobile Display Digital Interface Standard: Version 1. Milpitas, CA (Jul. 23, 2004), pp. 87-171.

3GPP2 C.S0047-0. "Link-Layer Assisted Service Options for Voice-over IP: Header Remover (SO60) and Robust Header Compression (SO61)," Version 1.0, Apr. 14, 2003, pp. 1-36.

Supplementary European Search Report—EP05852049—Search Authority—The Hugue—Aug. 17, 2011.

Taiwan Search Report—TW094118438—TIPO—Nov. 19, 2011.

"Nokia 6255", Retrieved from the Internet: URL: http://nokiamuseum.com/view.php model=6255 [retrieved on Feb. 4, 2012], 2 pgs.

Taiwan Search Report—TW093134825—TIPO—Jan. 28, 2012.

Taiwan Search Report—TW094141287—TIPO—May 5, 2012.

European Search Report—EP12189620—Search Authority—Munich—Dec. 14, 2012.

\* cited by examiner

LOW OUTPUT SKEW DOUBLE DATA RATE SERIAL ENCODER

CROSS REFERENCE TO RELATED APPLICATIONS

The present application is a Continuation in Part and claims priority to application Ser. No. 11/285,397 entitled "Double Data Rate Serial Encoder" filed Nov. 23, 2005, now allowed as U.S. Pat. No. 7,315,265, which claims priority to Provisional Application No. 60/630,853 entitled "MDDI Host Core Design" filed Nov. 24, 2004, Provisional Application No. 60/631,549 entitled "Mobile Display Digital Interface Host Camera Interface Device" filed Nov. 30, 2004, Provisional Application No. 60/632,825 entitled "Camera MDDI Host Device" filed Dec. 2, 2004, Provisional Application No. 60/633,071 entitled "MDDI Overview" filed Dec. 2, 2004, Provisional Application No. 60/633,084 entitled "MDDI Host Core Pad Design" filed Dec. 2, 2004, and Provisional Application No. 60/632,852 entitled "Implementation of the MDDI Host Controller" filed Dec. 2, 2004, which are assigned to the assignee hereof and hereby expressly incorporated herein by reference in their entireties.

The present application is also related to commonly assigned U.S. Pat. No. 6,760,772 B2, titled "Generating and Implementing a Communication Protocol and Interface for High Speed Data Transfer", issued Jul. 6, 2004, the disclosure of which is incorporated herein by reference.

BACKGROUND

1. Field

The present invention relates generally to a serial encoder for high data rate serial communication links. More particularly, the invention relates to a double data rate serial encoder for Mobile Display Digital Interface (MDDI) links.

2. Background

In the field of interconnect technologies, demand for ever increasing data rates, especially as related to video presentations, continues to grow.

The Mobile Display Digital Interface (MDDI) is a cost-effective, low power consumption, transfer mechanism that enables very-high-speed data transfer over a short-range communication link between a host and a client. MDDI requires a minimum of just four wires plus power for bi-directional data transfer that delivers a maximum bandwidth of up to 3.2 Gbits per second.

In one application, MDDI increases reliability and decreases power consumption in clamshell phones by significantly reducing the number of wires that run across a handset's hinge to interconnect the digital baseband controller with an LCD display and/or a camera. This reduction of wires also allows handset manufacturers to lower development costs by simplifying clamshell or sliding handset designs.

MDDI is a serial transfer protocol, and, as such, data received in parallel for transmission over an MDDI link needs to be serialized. U.S. patent application Ser. No. 11/285,397, entitled "Double Data Rate Serial Encoder", filed Nov. 23, 2005 describes an MDDI Double Data Rate (DDR) serial encoder having a glitchless output. The glitchless output serial encoder benefits from a glitchless multiplexer, designed with a priori knowledge of a Gray code input select sequence. This a priori knowledge of the input select sequence allows for a reduction in the size of the multiplexer and, subsequently, of that of the DDR serial encoder.

However, improvements can be made in several aspects to the DDR serial encoder design described in U.S. application Ser. No. 11/285,397. In one aspect, it is noted that the glitchless multiplexer used in the DDR serial encoder described in U.S. application Ser. No. 11/285,397 remains larger in size than a non-glitchless multiplexer. In another aspect, the number of logic layers between the final register stage and the encoder output, a factor that contributes to larger output skew and lower link rate, can be significantly reduced.

What is needed therefore is an MDDI DDR serial encoder having reduced size, complexity, and output skew. What is also needed is that the MDDI DDR serial encoder has a glitchless output.

BRIEF SUMMARY OF THE INVENTION

A Double Data Rate (DDR) serial encoder is provided herein.

In one aspect, the DDR serial encoder includes a non-glitchless multiplexer and digital logic for ensuring a glitch-free encoder output. By using a non-glitchless multiplexer, the size and complexity of the encoder is significantly reduced.

In another aspect, the DDR serial encoder has a single layer of logic between the final register stage and the encoder output and a reduced number of paths from the final register stage to the encoder output, thereby resulting in reduced output skew and increased link rate. The reduced number of paths from the final register stage to the encoder output also simplifies output skew analysis.

Further embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

Figure 1:
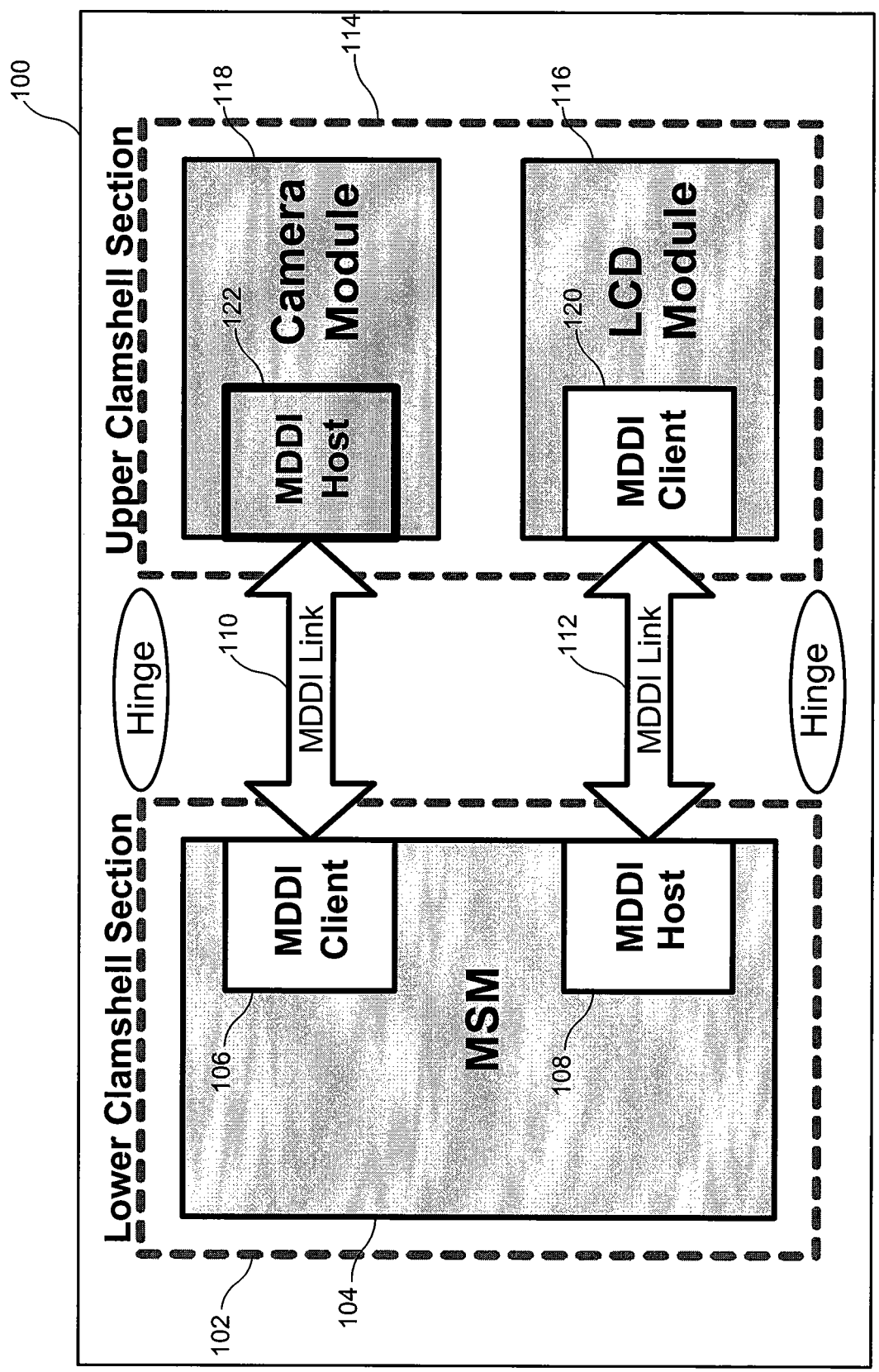
FIG. 1 is a block diagram that illustrates an example environment using a Mobile Display Digital Interface (MDDI) interface.

The specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Mobile Display Digital Interface (MDDI)

The Mobile Display Digital Interface (MDDI) is a cost-effective, low power consumption, transfer mechanism that enables very-high-speed serial data transfer over a short-range communication link between a host and a client.

In the following, examples of MDDI will be presented with respect to a camera module contained in an upper clamshell of a mobile phone. However, it would be apparent to persons skilled in the relevant art(s) that any module having functionally equivalent features to the camera module could be readily substituted and used in various embodiments of this invention.

Further, according to embodiments of the invention, an MDDI host may comprise one of several types of devices that can benefit from using the present invention. For example, the host could be a portable computer in the form of a handheld, laptop, or similar mobile computing device. It could also be a Personal Data Assistant (PDA), a paging device, or one of many wireless telephones or modems. Alternatively, the host could be a portable entertainment or presentation device such as a portable DVD or CD player, or a game playing device. Furthermore, the host can reside as a host device or control element in a variety of other widely used or planned commercial products for which a high speed communication link with a client is desired. For example, a host could be used to transfer data at high rates from a video recording device to a storage based client for improved response, or to a high resolution larger screen for presentations. An appliance such as a refrigerator that incorporates an onboard inventory or computing system and/or Bluetooth connections to other household devices, can have improved display capabilities when operating in an internet or Bluetooth connected mode, or have reduced wiring needs for in-the-door displays (a client) and keypads or scanners (client) while the electronic computer or control systems (host) reside elsewhere in the cabinet. In general, those skilled in the art will appreciate the wide variety of modern electronic devices and appliances that may benefit from the use of this interface, as well as the ability to retrofit older devices with higher data rate transport of information utilizing limited numbers of conductors available in either newly added or existing connectors or cables. At the same time, an MDDI client may comprise a variety of devices useful for presenting information to an end user, or presenting information from a user to the host. For example, a micro-display incorporated in goggles or glasses, a projection device built into a hat or helmet, a small screen or even holographic element built into a vehicle, such as in a window or windshield, or various speaker, headphone, or sound systems for presenting high quality sound or music. Other presentation devices include projectors or projection devices used to present information for meetings, or for movies and television images. Other examples include the use of touch pads or sensitive devices, voice recognition input devices, security scanners, and so forth that may be called upon to transfer a significant amount of information from a device or system user with little actual "input" other than touch or sound from the user. In addition, docking stations for computers and car kits or desk-top kits and holders for wireless telephones may act as interface devices to end users or to other devices and equipment, and employ either clients (output or input devices such as mice) or hosts to assist in the transfer of data, especially where high speed networks are involved. However, those skilled in the art will readily recognize that the present invention is not limited to these devices, there being many other devices on the market, and proposed for use, that are intended to provide end users with high quality images and sound, either in terms of storage and transport or in terms of presentation at playback. The present invention is useful in increasing the data throughput between various elements or devices to accommodate the high data rates needed for realizing the desired user experience.

FIG. 1 is a block diagram that illustrates an example environment using an MDDI interface. In the example of FIG. 1, MDDI is used to interconnect modules across the hinge of a clamshell phone 100. It must be noted here that while certain embodiments of the present invention will be described in the context of specific examples, such as MDDI interconnections in a clamshell phone, this is done for illustration purposes only and should not be used to limit the present invention to such embodiments. As will be understood by a person skilled in the relevant art(s) based on the teachings herein, embodiments of the present invention may be used in other devices including any that may benefit from having MDDI interconnections.

Referring to FIG. 1, a lower clamshell section 102 of clamshell phone 100 includes a Mobile Station Modem (MSM) baseband chip 104. MSM 104 is a digital baseband controller. An upper clamshell section 114 of clamshell phone 100 includes a Liquid Crystal Display (LCD) module 116 and a camera module 118.

Still referring to FIG. 1, an MDDI link 110 connects camera module 118 to MSM 104. Typically, an MDDI link controller is integrated into each of camera module 118 and MSM 104. In the example of FIG. 1, an MDDI Host 122 is integrated into camera module 112, while an MDDI Client 106 resides on the MSM side of the MDDI link 110. Typically, the MDDI host is the master controller of the MDDI link. In the example of FIG. 1, pixel data from camera module 118 are received and formatted into MDDI packets by MDDI Host 122 before being transmitted onto MDDI link 110. MDDI client 106 receives the MDDI packets and re-converts them into pixel data of the same format as generated by camera module 118. The pixel data are then sent to an appropriate block in MSM 104 for processing.

Still referring to FIG. 1, an MDDI link 112 connects LCD module 116 to MSM 104. In the example of FIG. 1, MDDI link 112 interconnects an MDDI Host 108, integrated into MSM 104, and an MDDI Client 120 integrated into LCD module 116. In the example of FIG. 1, display data generated by a graphics controller of MSM 104 are received and formatted into MDDI packets by MDDI Host 108 before being transmitted onto MDDI link 112. MDDI client 120 receives the MDDI packets and re-converts them into display data for use by LCD module 116.

Figure 2:
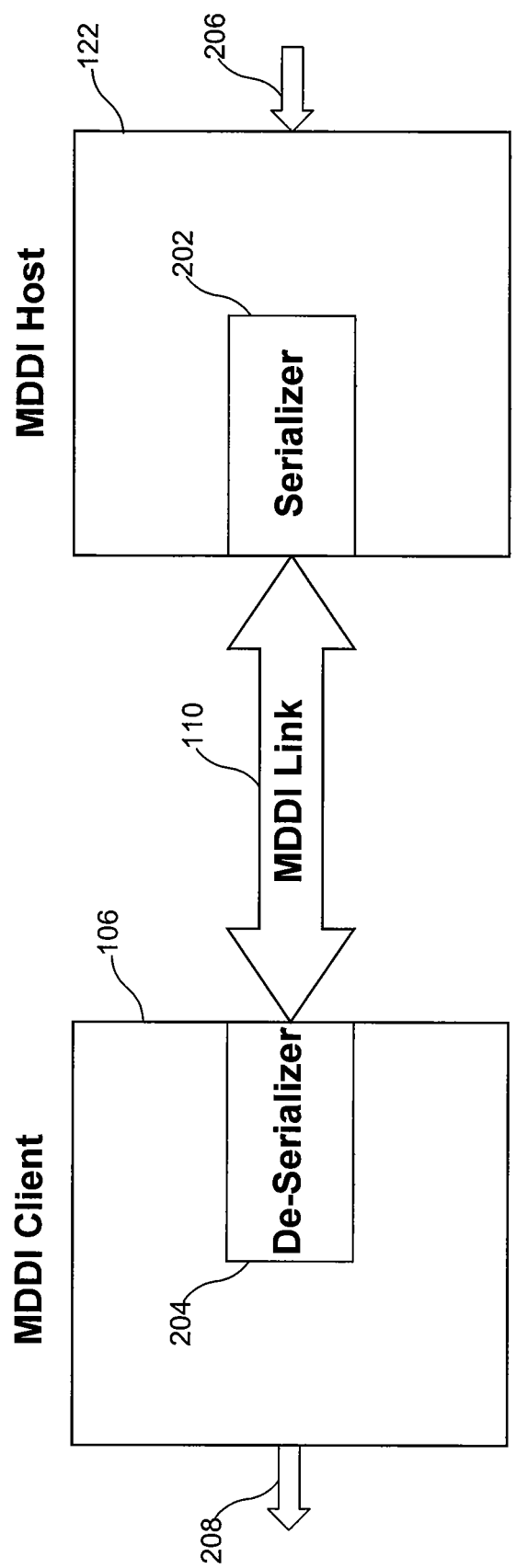
FIG. 2 is a block diagram that illustrates an MDDI link interconnection according to an embodiment of the example of FIG. 1.

FIG. 2 is a block diagram that illustrates MDDI link interconnection 110 according to the example of FIG. 1. As described above, one of the functions of MDDI link 110 is to transfer pixel data from camera module 118 to MSM 104. Accordingly, in the embodiment of FIG. 2, a frame interface 206 connects camera module 118 to MDDI Host 122. The frame interface 206 serves to transfer pixel data from camera module 118 to MDDI Host 122.

Typically, camera module 118 receives pixel data from a camera through a parallel interface, stores the pixel data, and then transfers it to MDDI Host 122 when the host is ready. MDDI Host 122 encapsulates the received pixel data into MDDI packets. However, in order for MDDI Host 122 to be able to transmit the pixel data onto MDDI link 110, a serialization of the MDDI packets is necessary.

In the embodiment of FIG. 2, a serializer module 202, integrated within MDDI Host 122, serves to serially shift out the MDDI packets onto MDDI link 110. At the MSM end of MDDI link 110, a de-serializer module 204, integrated within MDDI client 106, re-constructs the MDDI packets from the serial data received over MDDI link 110. MDDI client 106 then removes the MDDI encapsulation and transfers the parallel pixel data through a frame interface 208 to an appropriate block of MSM 104.

MDDI Serial Encoder

Figure 3:
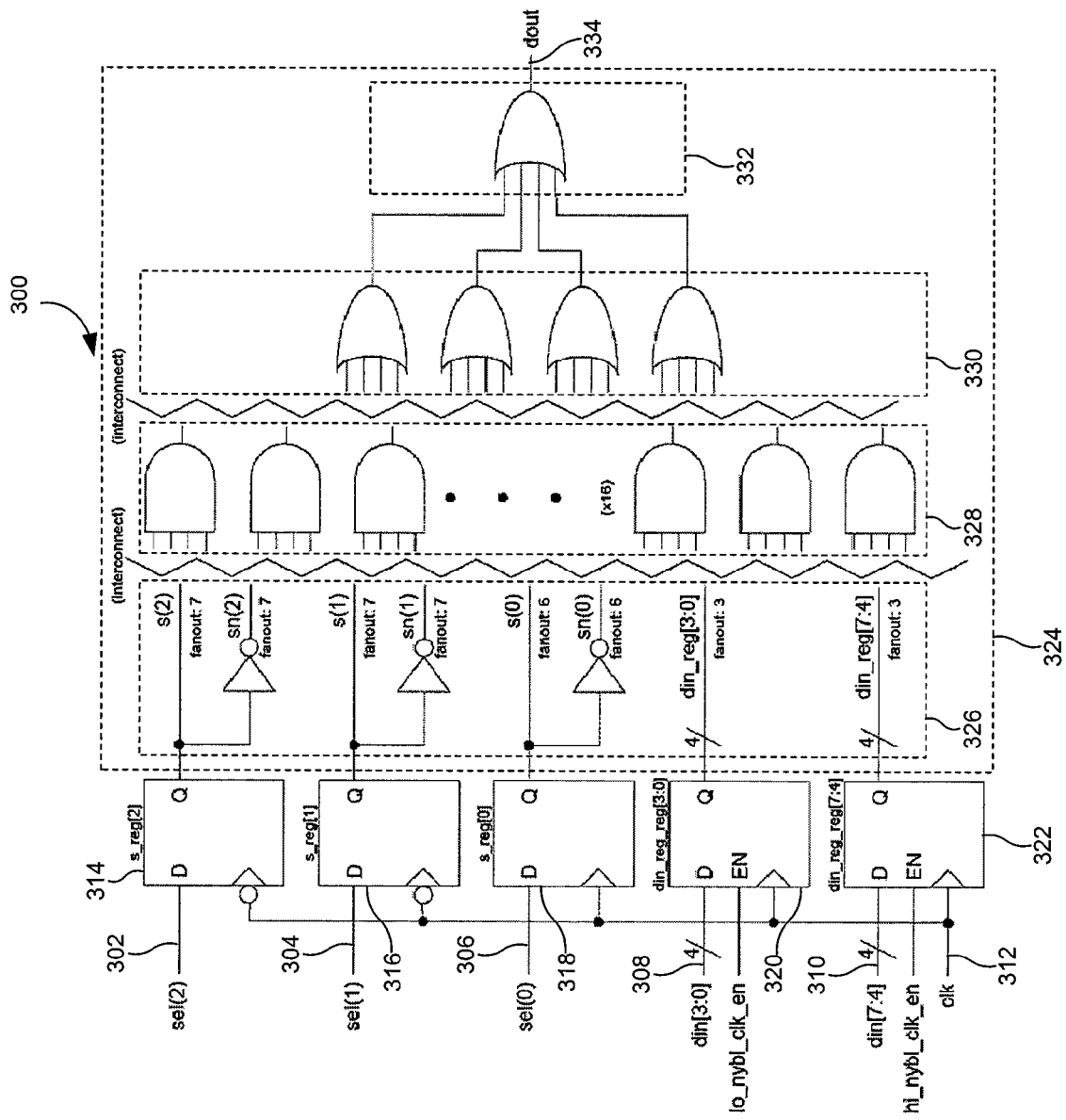
FIG. 3 is a circuit diagram that illustrates an MDDI serial encoder.

FIG. 3 is a circuit diagram that illustrates an MDDI serial encoder 300. MDDI serial encoder 300 is described in more detail in U.S. application Ser. No. 11/285,397, entitled "Double Data Rate Serial Encoder", filed Nov. 23, 2005. Serial encoder 300 includes a final data register stage, illustrated using flip-flops 320 and 322, a select input register stage, illustrated using flip-flops 314, 316, and 318, and a glitchless multiplexer circuitry 324.

The final data register stage flip-flops 320 and 322 receive data input signals 308 and 310, respectively. In one embodiment, data input signals 308 and 310 are each 4 bits. Accordingly, flip-flops 320 and 322 are each 4-bit flip-flops. In other embodiments, flip-flops 320 and 322 may be replaced with four 2-bit flip-flops or eight 1-bit flip-flops. As illustrated in FIG. 3, flip-flops 320 and 322 are D flip-flops, but other types of flip-flops or registers may also be used as understood by a person skilled in the art based on the teachings herein. Flip-flops 320 and 322 are controlled by a clock signal 312 and update their outputs at every rising edge of clock signal 312.

The select input register stage flip-flops 314, 316, and 318 receive select input signals sel(2) 302, sel(1) 304, and sel(0) 306, respectively. Select input signals 302, 304, and 306 are typically provided by a counter and are used to select the input of multiplexer circuitry 324. In one embodiment, select signals 302, 304, and 306 are generated according to a Gray code sequence, which is known a priori by multiplexer circuitry 324, thereby allowing a glitchless multiplexer output. Flip-flops 314, 316, and 318 are D flip-flops, but other types of flip-flops may also be used as understood by a person skilled in the art based on the teachings herein. Flip-flops 314, 316, and 318 are also controlled by clock signal 312, with flip-flop 318 updating its output at rising edges of clock signal 312 and flip-flops 314 and 316 updating their outputs at falling edges of clock signal 312.

Multiplexer circuitry 324 receives data input signals from the final data register stage and input select signals from the select input register stage, and generates the output 334 of serial encoder 300. Multiplexer circuitry 324 generates a glitchless encoder output using a priori knowledge of the Gray code input select sequence. Multiplexer circuitry 324 includes four layers of logic 326, 328, 330, and 332 that separate the final data register stage (flip-flops 320 and 322) and the select input register stage (flip-flops 318, 320, and 332) from the encoder output 334. Logic layer 326 includes inverter circuitry on certain paths from the select input register stage to the encoder output. Logic layer 326 is coupled via an interconnect to logic layer 328, which includes a plurality of AND gates. In turn, logic layer 328 is coupled via an interconnect to logic layer 330. Logic layer 330 includes a plurality of OR gates, which provide the inputs of logic layer 332. Logic layer 332 includes an OR gate that provides the output 334 of the serial encoder.

It is noted that the four logic layers 326, 328, 330, and 332 of multiplexer circuitry 324 are based on combinatorial logic and are not driven by clock signals. Accordingly, signal propagation delays on different paths from the final data register stage and/or the select input register stage to the encoder output may be different. Further, signal propagation delays could vary according to temperature and/or process variations in the encoder circuitry, making them difficult to monitor and/or to compensate for.

Typically, having different signal propagations delays on paths to the encoder output results in what is known as "output skew", with the actual encoder output being skewed or distorted relative to a desired nominal output. Output skew may also result from the skewing of a single signal that contributes to the encoder output.

Figure 4A:
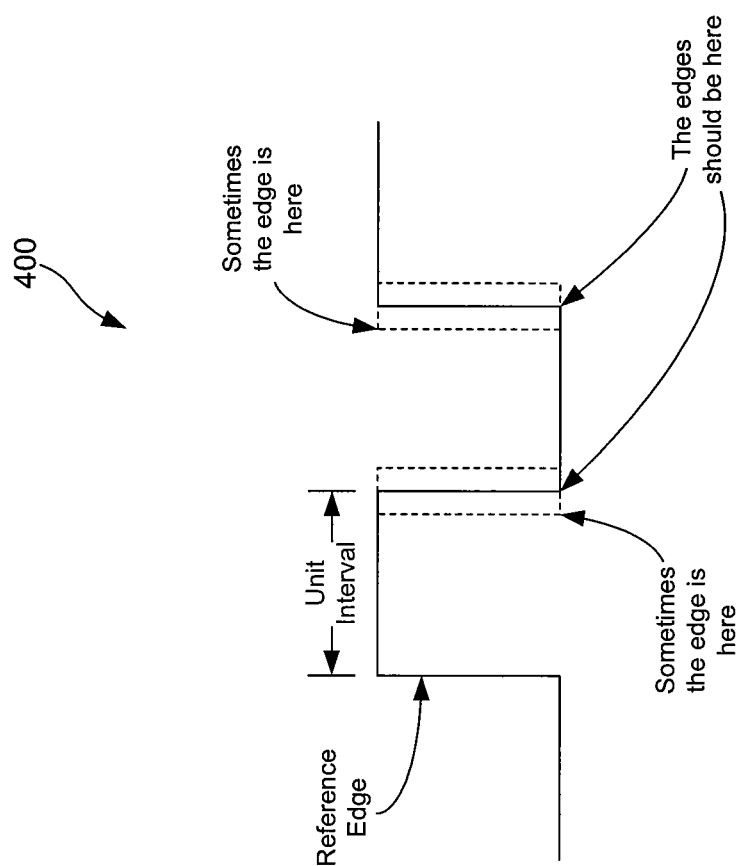
FIGS. 4A-B illustrate example of signal skew.
Figure 4B:
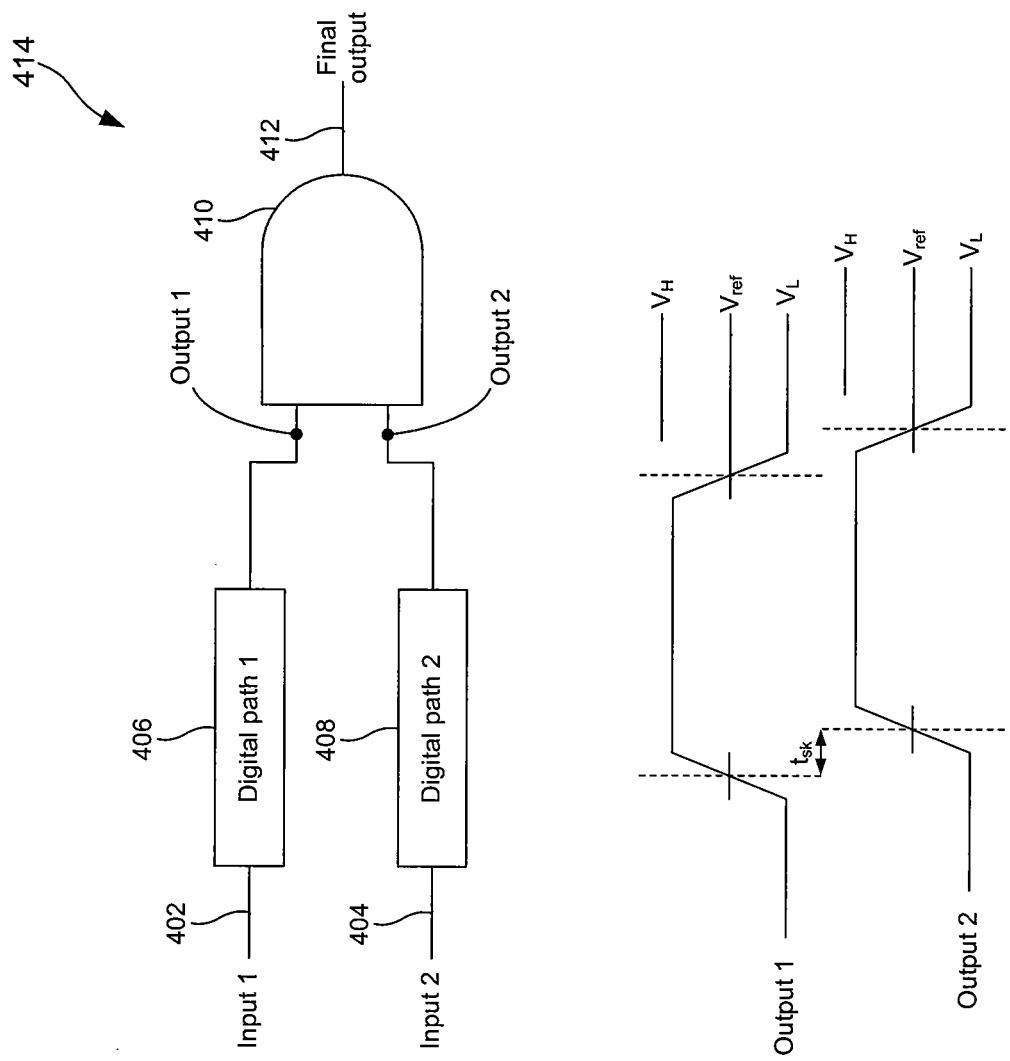

FIGS. 4A-B illustrate examples of signal skew. FIG. 4A illustrates skew in an example signal 400, whereby falling and/or rising edges may occur earlier or later than when they should ideally occur. FIG. 4B illustrates skew between two signals Output 1 and Output 2. Output 1 and Output 2 result from synchronized input signals 402 and 402 propagating through paths 406 and 408 respectively of exemplary circuit 414, with paths 406 and 408 having different signal propagation delays. The skew between signals Output 1 and Output 2, illustrated as "$t_{sk}$" in FIG. 4B, represents the time difference magnitude between signals Output 1 and Output 2, which ideally would occur simultaneously. Note that the skew between signals Output 1 and Output 2 could result in an output skew at output 412 of exemplary circuit 414.

In certain cases, output skew may cause a reduction in the maximum MDDI link rate. It is evident therefore that output skew should be minimized.

Low Output Skew MDDI Serial Encoder

According to the present invention, output skew is reduced by minimizing the effects of factors that contribute thereto. In one aspect, output skew is affected by the individual skew of each signal (from the final data register stage and/or the select input register stage) that contributes to the encoder output. In another aspect, output skew is proportional to the magnitudes of these individual signal skews, which, in turn, are proportional to the lengths of their respective signal paths (a function of the number of successive logic layers to reach the encoder output).

As such, output skew can be reduced by minimizing: (1) the number of signals (from the final data register stage and/or select input register stage) that contributes to the encoder output, and (2) the number of logic layers from the final data register stage and/or the select input register stage to the encoder output.

Figure 5:
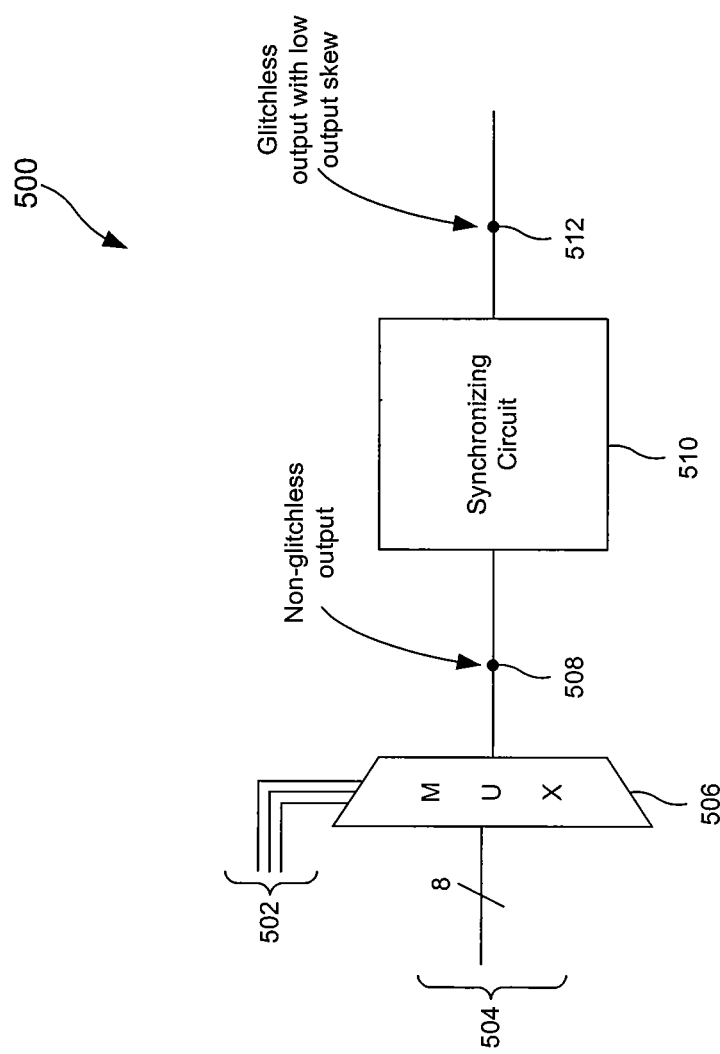
FIG. 5 is a block diagram that illustrates an MDDI serial encoder according to an embodiment of the present invention.

FIG. 5 is a block diagram that illustrates an MDDI serial encoder 500 according to an embodiment of the present invention. Serial encoder 500 includes a non-glitchless multiplexer 506 and a synchronizing circuit 510.

Non-glitchless multiplexer 506 receives data input signal 504 and input select signals 502 and generates output signal 508. In an embodiment, data input signal 504 includes an 8-bit signal. In other embodiments, data input signal 504 includes two 4-bit signals, four 2-bit signals, or eight 1-bit signals. Input select signals 502 control multiplexer 506 to couple one of the received data input signals to the output of the multiplexer. Typically, the number, N, of input select signals 502 is such that $2^N$ equals the number of data bits in signal 504. In FIG. 5, the number of input select signals 502 is 3, making multiplexer 506 an 8:1 multiplexer.

Since the output 508 of multiplexer 506 may be non-glitchless, serial encoder 500 can be significantly simplified. In one aspect, data bits in input signal 504 are allowed to switch at any time and not only when they are not being selected for output, as in a glitchless multiplexer. In another aspect, the input selection sequence carried by input select signals 502 no longer need to adhere to a Gray code sequence.

Accordingly, to generate a glitchless encoder output, a synchronizing circuit 510 is used to ensure that any glitches in output 508 are removed at encoder output 512. In one embodiment, synchronizing circuit 510 includes a clock-driven final data register stage that enables signals contributing to the encoder output to have minimal skew relative to each other. In addition, the final data register stage is a very small number of logic layers away from the encoder output, further reducing output skew.

Figure 6:
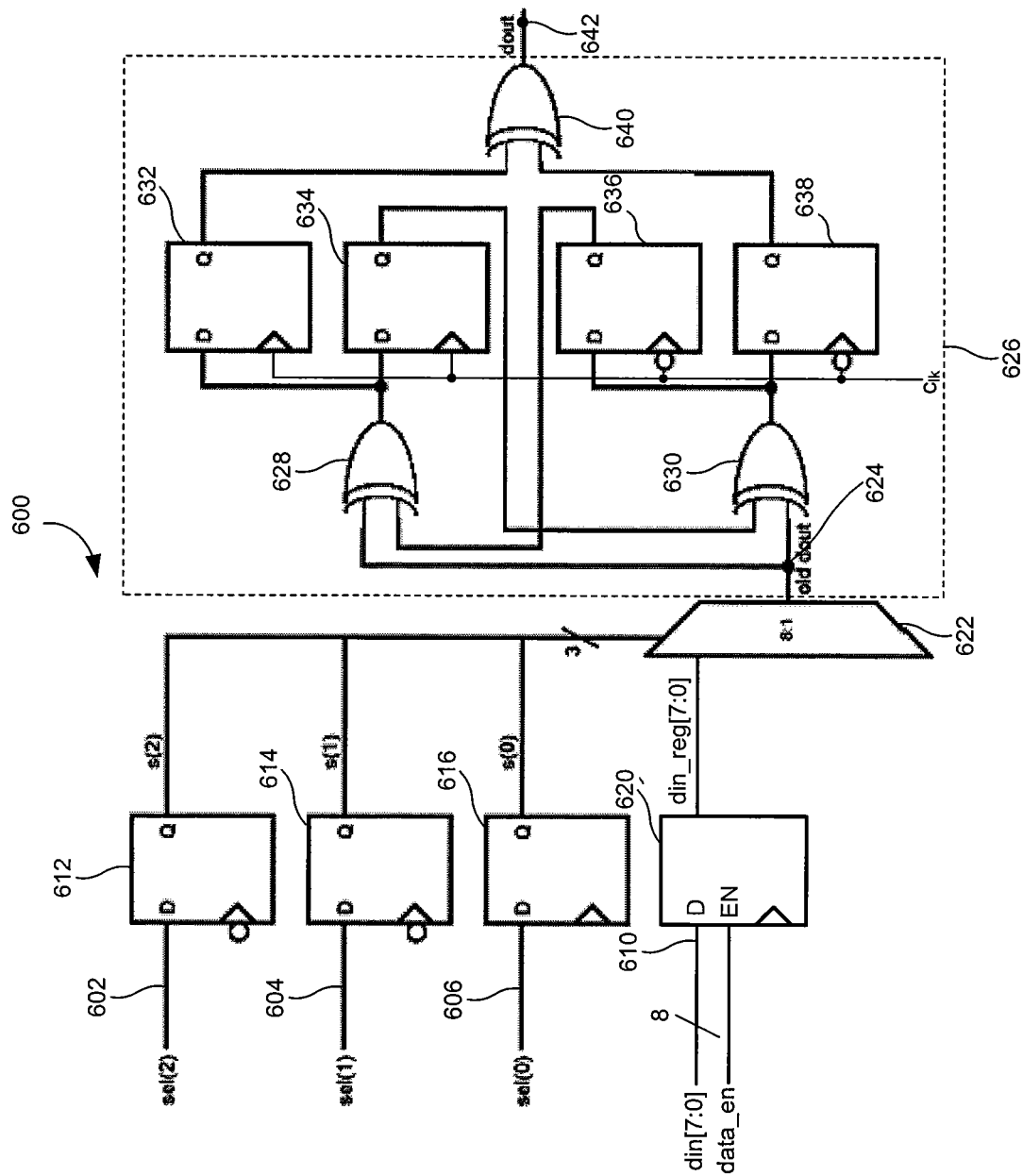
FIG. 6 is a circuit diagram that illustrates an MDDI serial encoder according to another embodiment of the present invention.

FIG. 6 is a circuit diagram that illustrates an MDDI serial encoder 600 according to another embodiment of the present invention.

Serial encoder 600 includes a data register stage, illustrated using flip-flop 620, a select input register stage, illustrated using flip-flops 612, 614, and 616, a multiplexer 622, and a synchronizing circuit 626.

The data register stage flip-flop 620 receives data input signal 610. In one embodiment, data input signal 610 includes an 8-bit signal. Accordingly, flip-flop 620 is an 8-bit flip-flop. In other embodiments, flip-flop 620 may be replaced with two 4-bit flip-flops, four 2-bit flip-flops, or eight 1-bit flip-flops. As illustrated in FIG. 6, flip-flop 620 is a D flip-flop, but other types of flip-flops or registers may also be used as understood by a person skilled in the art based on the teachings herein.

The select input register stage flip-flops 612, 614, and 616 receive select input signals sel(2) 602, sel(1) 604, and sel(0) 606, respectively. Select input signals 602, 604, and 606 are typically provided by a counter and are used to select the input of multiplexer 622. Select signals 602, 604, and 606 need not adhere to any type of input selection sequence, such as a Gray code sequence, for example. Flip-flops 612, 614, and 616 are D flip-flops, but other types of flip-flops may also be used as understood by a person skilled in the art based on the teachings herein.

Multiplexer 622 receives data input signals from the data register stage and input select signals from the select input register stage, and generates output signal 624. In one embodiment, multiplexer 622 is an 8:1 multiplexer.

Multiplexer 622 is a non-glitchless multiplexer. In other words, glitches may occur in output 624 of multiplexer 622. Accordingly, output 624 of multiplexer 622 is provided to a synchronizing circuit 626 to ensure that any glitches in output 624 are removed at encoder output 642.

Synchronizing circuit 626 includes a first XOR stage, illustrated using XOR gates 628 and 630, a final data register stage, illustrated using flip-flops 632, 634, 636, and 638, and a final XOR stage, illustrated using XOR gate 640, to generate encoder output 642.

The first XOR stage gates 628 and 630 receive output signal 624 and feedback signals from flip-flops 636 and 634, respectively. The outputs of XOR gates 628 and 630 are respectively received by flip-flops 632, 634 and 636, 638. Flip-flops 632, 634, 636, and 638 are controlled by a clock signal clk, with flip-flops 632 and 634 updating outputs at rising edges of the clock signal and flip-flops 636 and 638 updating outputs at falling edges of the clock signal.

Flip-flops 634 and 636 are feedback flip-flops of the final data register stage having their outputs cross-coupled to XOR gates 628 and 630 of the first XOR stage. In other embodiments, the feedback signals to XOR gates 628 and 630 are provided from the outputs of flip-flops 638 and 632 respectively, with flip-flops 634 and 636 eliminated from the final data register stage. A more stable design, however, is achieved by using flip-flops 634 and 636 to provide the feedback signals to the first XOR stage. This reduces any additional routing of the outputs of flip-flops 632 and 638, which then need to only be input into the final XOR stage of synchronizing circuit 626.

The final XOR stage of synchronizing circuit 626 includes a single XOR gate 640, which receives the outputs of flip-flops 632 and 638 and outputs encoder output 642. Encoder output 642 is a glitchless output with low output skew.

It is noted that in serial encoder 600, a single layer of logic separates the final data register stage from the encoder output. Accordingly, the individual skew of signals contributing to the encoder output remains very low. Further, it is noted that only two signals from the final data register stage (outputs of flip-flops 632 and 638) contribute to encoder output 642, further reducing output skew. The reduced number of paths from the final register stage to the encoder output also simplifies output skew analysis.

Figure 8:
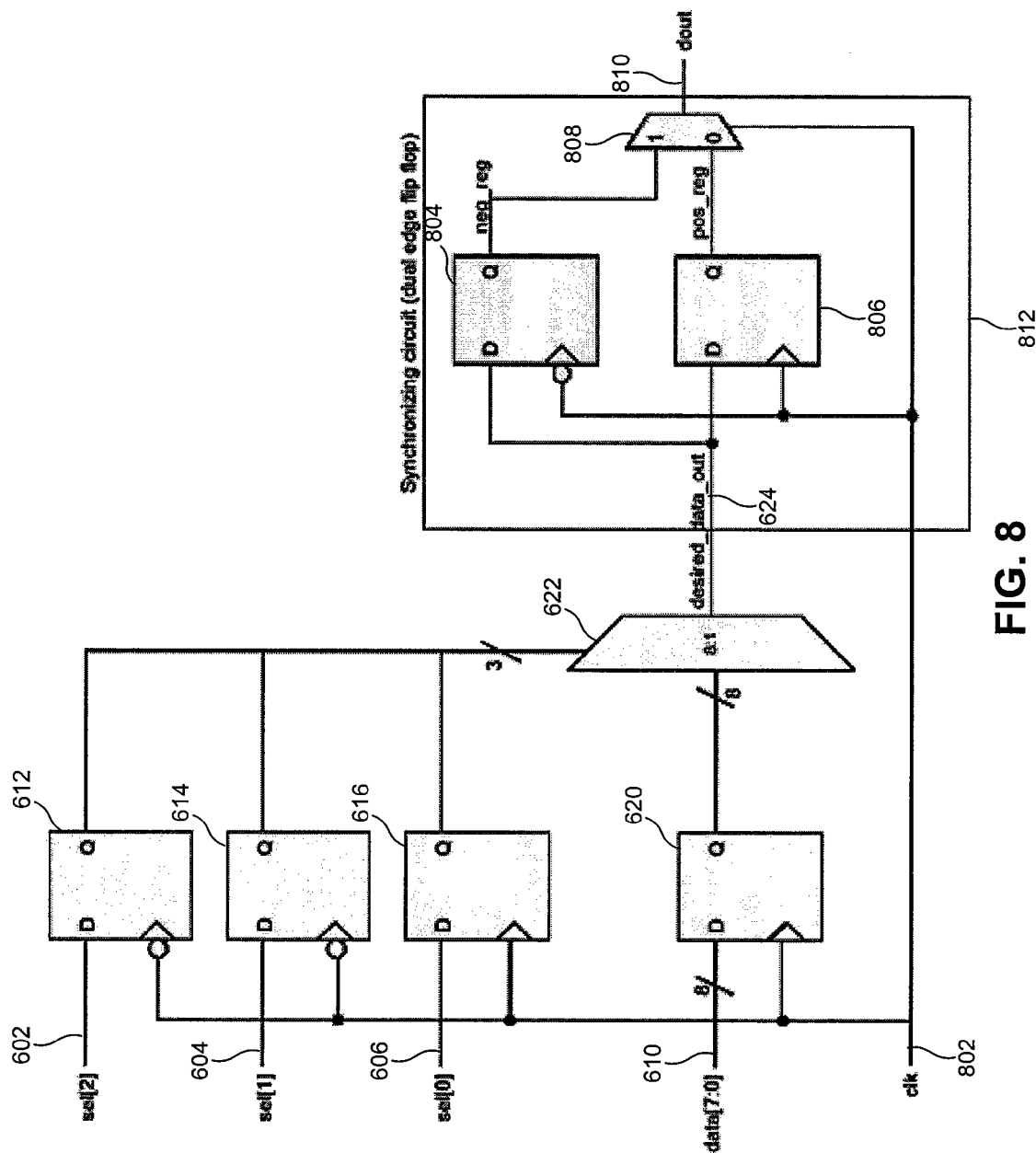
FIG. 8 is a circuit diagram that illustrates an MDDI serial encoder according to a further embodiment of the present invention.

FIG. 8 is a circuit diagram that illustrates an MDDI serial encoder 800 according to a further embodiment of the present invention. MDDI serial encoder 800 is similar in several respects to MDDI serial encoder 600 of FIG. 6, but employs a different synchronizing circuit implementation 812. It is noted that, in practice, the synchronizing circuit is equivalent to a dual edge flip-flop, and accordingly, any implementation of a dual edge flip-flop or functionally equivalent circuitry may be used for the synchronizing circuit according to embodiments of the present invention.

In FIG. 8, synchronizing circuit 812 includes a final data register stage, illustrated using flip flops 804 and 806, and a multiplexer 808. Flip flops 804 and 806 receive output signal 624 of multiplexer 622 and are controlled by clock signal 802, with flip flop 804 updating its output at rising edges of clock signal 802 and flip flop 806 updating its output at falling edges of clock signal 802. The outputs of flip flops 804 and 806 subsequently form inputs to multiplexer 808. Multiplexer 808 is also controlled by clock signal 802, with the output of flip flop 804 being output from multiplexer 808 when the clock signal 802 is high and the output of flip flop 806 being output from multiplexer 808 when the clock signal 802 is low, to generate the encoder output 810. It is noted that, in embodiment 800, the encoder output 810 has a race condition on clock signal 802. This race condition is a result of a rising or falling edge in click signal 802 causing the currently selected input to multiplexer 808 to change. The encoder output 810 is glitchless only if a rising or falling edge of clock signal 802 has selected the other input of the multiplexer 808 as the encoder output 810 before the current input changes. As an example, when clock signal 802 is low, the output of flip flop 806 is being output from multiplexer 808 as encoder output 810. At a rising edge of the clock signal 802, the output of flip flop 806 will update to a new state while at the same time the output of flip flop 804 is selected as the output of multiplexer 808 as encoded output 810. To avoid glitches on encoder output 810, the delay from clock signal 802 through multiplexer 808 to the encoder output 810 must be less than the delay from clock signal 802 through flip flops 804 or 806 to multiplexer 808. As long as this timing condition is met, encoder output 810 is a glitchless output with low output skew.

It is also noted that in serial encoder 800, a single layer of logic separates the final data register stage from the encoder output with only two signals from the final data register stage contributing to encoder output 810, thereby resulting in a reduced output skew and simplified output skew analysis.

Example Timing Diagrams

Figure 7:
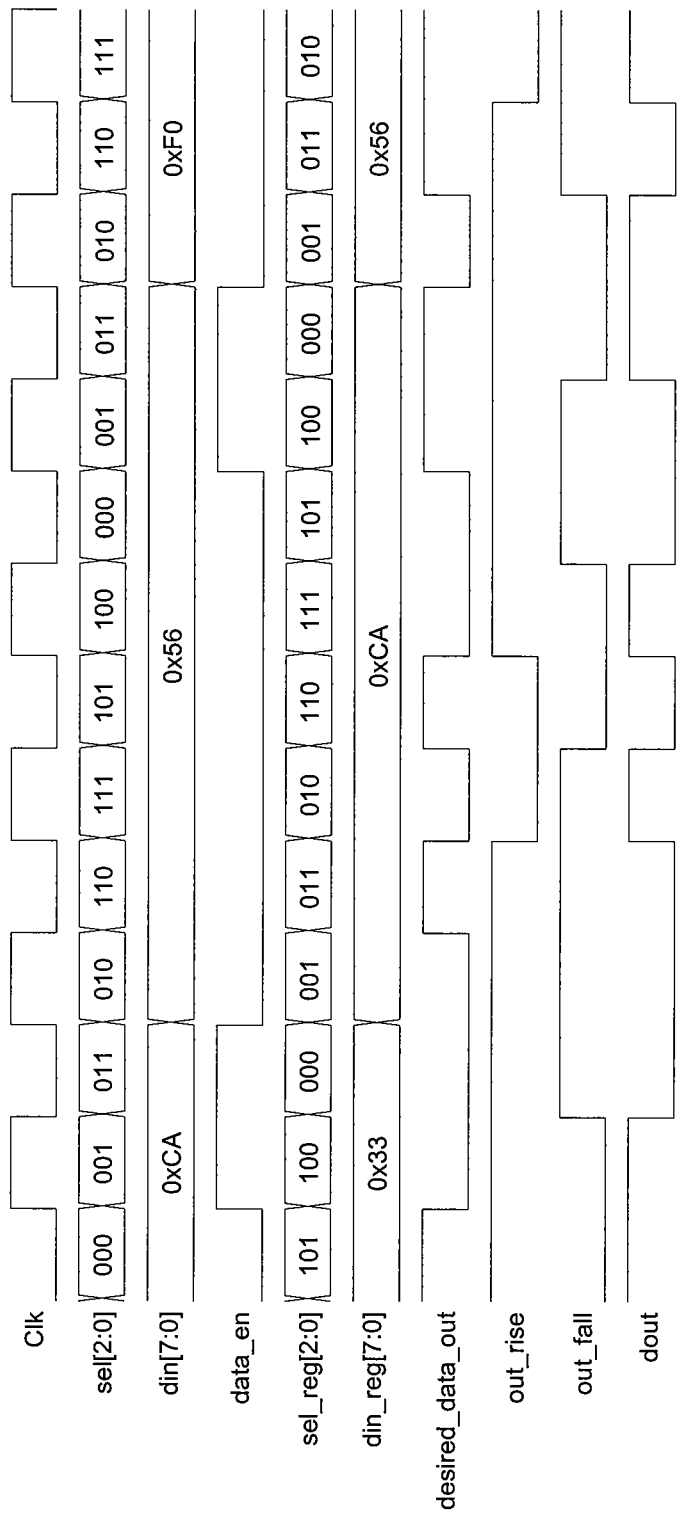
FIG. 7 is an example timing diagram relating signals of the MDDI serial encoder of FIG. 6.

FIG. 7 is an example timing diagram relating signals of MDDI serial encoder 600 of FIG. 6. In this example diagram, the select inputs transitions, illustrated as signal sel[2:0] in FIG. 7, are in accordance with a Gray code sequence as typically required for MDDI encoders with glitchless multiplexer. Accordingly, multiplexer 622 of FIG. 6 operates identically to a glitchless multiplexer, but without the glitch free output requirement. Note that the select inputs sequence in FIG. 7 is an exemplary one and that other select inputs sequences may also be used.

Signal din[7:0] in FIG. 7 corresponds to data input signal 610 in FIG. 6. An exemplary sequence of signal din[7:0] is provided in FIG. 7.

Signal din_reg[7:0] corresponds to signal din_reg[7:0] illustrated in FIG. 6, and can be generated from signal din[7:0] according to signal data_en in FIG. 7. An exemplary sequence of signal din_reg[7:0] is provided in FIG. 7.

Signal desired_data_out corresponds to signal 624 in FIG. 6.

Signals out_rise and out_fall correspond to the outputs of flip-flops 632 and 638, respectively. Note that out_rise=(desired_data_out XOR out_fall) and that out_fall=(desired_data_out XOR out_rise). Also note that signal dout=out_rise XOR out_fall. Accordingly, either of the two final output registers can drive the desired_data_out value to dout by holding or inverting its output. Signal dout is equivalent to signal desired_data_out but is delayed by ½ clock cycle.

Figure 9:
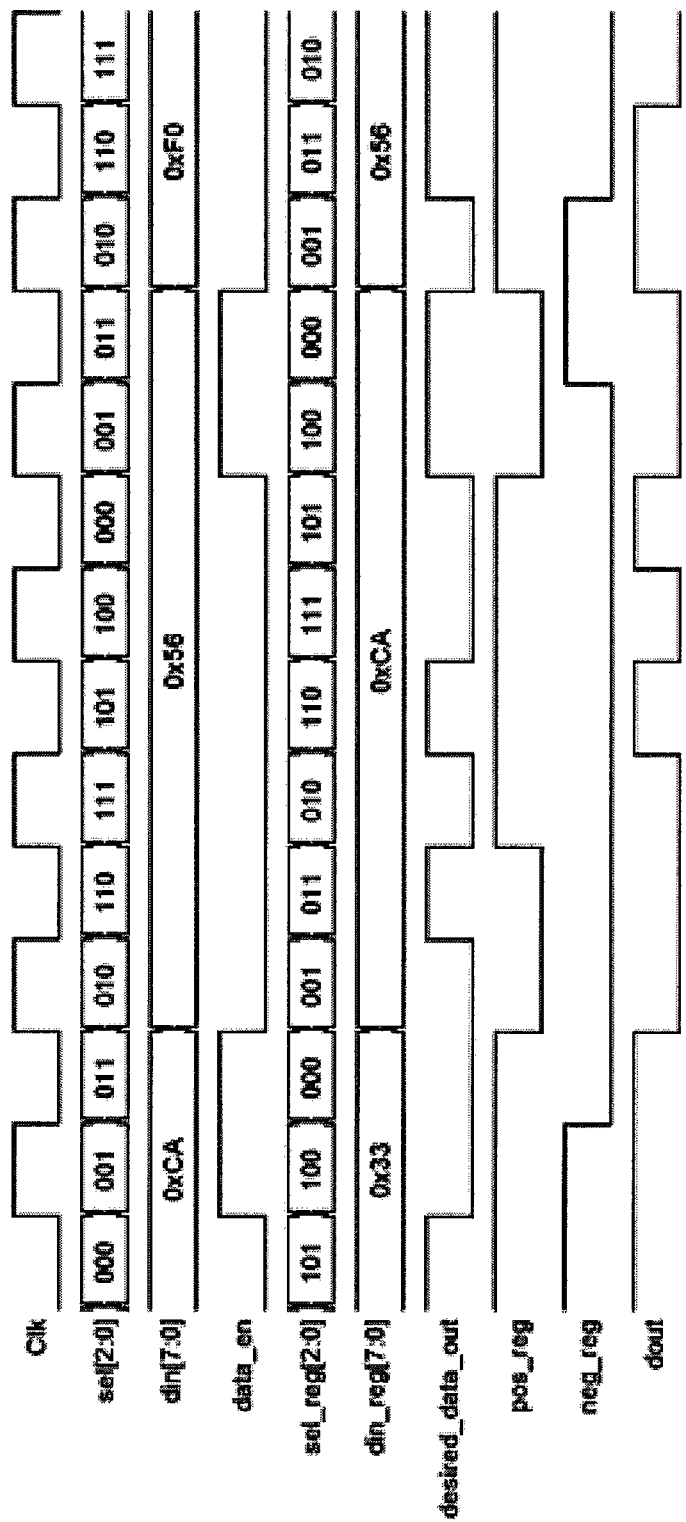
FIG. 9 is an example timing diagram relating signals of the MDDI serial encoder of FIG. 8.

FIG. 9 is an example timing diagram relating signals of MDDI serial encoder 800 of FIG. 8. Similar to the example timing diagram of FIG. 7, the select inputs transitions, illustrated as sel[2:0] in FIG. 9, are in accordance with a Gray code sequence as typically required for MDDI encoders with glitchless multiplexer. Note, however, that the select inputs sequence illustrated in FIG. 9 is only exemplary and that other select inputs sequences may also be used.

Signal din[7:0] in FIG. 9 corresponds to data input signal 610 in FIG. 8. An exemplary sequence of signal din[7:0] is provided in FIG. 9.

Signal din_reg[7:0] corresponds to the output of flip-flop 620 in FIG. 8. An exemplary sequence of signal din_reg[7:0] is provided in FIG. 9.

Signal desired_data_out corresponds to signal 624 in FIG. 8.

Signals pos_reg and neg_reg correspond to the outputs of flip-flops 804 and 806, respectively, in FIG. 8.

Signal dout corresponds to encoder output dout 810 in FIG. 8. Note that dout is equivalent to desired_data_out signal, but is delayed by 1 clock cycle, with ½ clock cycle delay due to flip-flop 804 and 806 and ½ clock cycle delay due to multiplexer 808.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A serial encoder, comprising:
   a multiplexer having a plurality of data inputs, a plurality of select inputs, and an output;
   a plurality of data input flip-flops coupled to the data inputs of the multiplexer;
   a plurality of select input flip-flops coupled to the select inputs of the multiplexer; and
   a synchronizing circuit coupled to the output of the multiplexer and providing an output of the serial encoder, wherein the synchronizing circuit comprises a final data register stage, and the final data register stage is separated by a single logic layer from the output of the serial encoder, thereby resulting in a low output skew of the encoder, and wherein the synchronizing circuit substantially eliminates any output glitches from the output of the multiplexer.

2. An encoder according to claim 1, wherein the multiplexer has eight data inputs and three select inputs.

3. An encoder according to claim 1, wherein claim the multiplexer is a non-glitchless multiplexer.

4. An encoder according to claim 1, wherein the data input flip-flops and the select input flip-flops are D flip-flops.

5. An encoder according to claim 1, wherein the select inputs of the multiplexer are provided by a counter according to a clock signal.

6. An encoder according to claim 5, wherein the multiplexer outputs a bit at every edge of the clock signal.

7. An encoder according to claim 1, wherein the final data register stage is clock-driven.

8. An encoder according to claim 1, wherein the encoder receives a parallel data input and serially outputs the data input onto a serial communications link.

9. An encoder according to claim 8, wherein the serial communications link is a Mobile Display Digital Interface (MDDI) link.

10. An encoder according to claim 1, wherein the synchronizing circuit is implemented using any dual edge flip-flop.

11. A serial encoder, comprising:
- means for storing a plurality of data input bits;
- means for storing a plurality of select input bits;
- means for serially outputting the plurality of data input bits according to an input selection sequence generated by the plurality of select input bits; and
- means for eliminating glitches from an output of said serial outputting means, thereby generating a glitchless serial encoder output, wherein said means for eliminating glitches includes a clock-driven register stage, wherein said register stage is separated by a single logic layer from the serial encoder output, thereby resulting in a low output skew of the encoder.

12. A serial encoder according to claim 11, wherein said means for eliminating glitches includes a synchronizing circuit.

13. A serial encoder according to claim 11, wherein said serial outputting means outputs a bit at every edge of a clock signal, thereby making the serial encoder a double data rate encoder.

14. A serial encoder according to claim 11, wherein the encoder receives a parallel data input and serially outputs the data input onto a serial communications link.

15. A serial encoder according to claim 14, wherein the serial communications link is a Mobile Display Digital Interface (MMDI) link.

16. A serial encoder according to claim 11, wherein said means for eliminating glitches includes a dual edge flip-flop.

17. A serial encoder, comprising:
- a multiplexer having a plurality of data inputs, a plurality of select inputs, and an output;
- a plurality of data input flip-flops coupled to the data inputs of the multiplexer;
- a plurality of select input flip-flops coupled to the select inputs of the multiplexer; and
- a synchronizing circuit coupled to the output of the multiplexer and providing an output of the serial encoder, wherein the synchronizing circuit comprises a final data register stage and wherein the output of the serial encoder is solely determined by two signals from the final data register stage of the synchronizing circuit, thereby resulting in a low output skew of the encoder, wherein the synchronizing circuit substantially eliminates any output glitches from the output of the multiplexer.

18. An encoder according to claim 17, wherein claim the multiplexer is a non-glitchless multiplexer.

19. An encoder according to claim 17, wherein the select inputs of the multiplexer are provided by a counter according to a clock signal.

20. An encoder according to claim 17, wherein the final data register stage is clock-driven.

21. An encoder according to claim 17, wherein the encoder receives a parallel data input and serially outputs the data input onto a serial communications link.

22. A serial encoder, comprising:
- means for storing a plurality of data input bits;
- means for storing a plurality of select input bits;
- means for serially outputting the plurality of data input bits according to an input selection sequence generated by the plurality of select input bits; and
- means for eliminating glitches from an output of said serial outputting means, thereby generating a glitchless serial encoder output, wherein said means for eliminating glitches includes a clock-driven register stage, and wherein the serial encoder output is solely determined by two signals from said register stage, thereby resulting in a low output skew of the encoder.

23. A serial encoder according to claim 22, wherein said means for eliminating glitches includes a synchronizing circuit.

24. A serial encoder according to claim 22, wherein said serial outputting means outputs a bit at every edge of a clock signal, thereby making the serial encoder a double data rate encoder.

25. A serial encoder according to claim 22, wherein the encoder receives a parallel data input and serially outputs the data input onto a serial communications link.

26. A storage media comprising program instructions which are computer-executable to serially encode data by employing:
- a serial encoder, comprising:
    - a multiplexer having a plurality of data inputs, a plurality of select inputs, and an output;
    - a plurality of data input flip-flops coupled to the data inputs of the multiplexer;
    - a plurality of select input flip-flops coupled to the select inputs of the multiplexer; and
    - a synchronizing circuit coupled to the output of the multiplexer and providing an output of the serial encoder, wherein the synchronizing circuit comprises a final data register stage; and the final data register stage is separated by a single logic layer from the output of the serial encoder,
- the storage media comprising:
    - (a) program instructions that cause a low output skew of the encoder; and,
    - (b) program instructions that cause output glitches from the output of the multiplexer to be substantially eliminated.

27. The storage media of claim 26 further comprising program instructions that cause a counter to provide select inputs to the multiplexer according to a clock signal.

28. The storage media of claim 27 further comprising program instructions that cause the multiplexer to output a bit at every edge of the clock signal.

29. The storage media of claim 26 further comprising program instructions that cause the final data register stage to be driven by the clock.

30. A storage media comprising program instructions which are computer-executable to serially encode data by employing:
- a serial encoder, comprising:
    - a multiplexer having a plurality of data inputs, a plurality of select inputs, and an output;
    - a plurality of data input flip-flops coupled to the data inputs of the multiplexer;
    - a plurality of select input flip-flops coupled to the select inputs of the multiplexer; and
    - a synchronizing circuit coupled to the output of the multiplexer and providing an output of the serial encoder, wherein the synchronizing, circuit comprises a final data register stage,
- the storage media comprising:
    - program instructions that cause the output of the serial encoder to be determined solely based on two signals from the final data register stage: of the synchronizing circuit, thereby resulting in a low output skew of the encoder; and
    - program instructions that cause output glitches from the output of the multiplexer to be substantially eliminated.

31. The storage media of claim 30 further comprising program instructions that cause a counter to provide select inputs to the multiplexer according to a clock signal.

32. The storage media of claim 30 further comprising program instructions that cause the final data register stage to be driven by the clock.

33. A method of serial encoding, comprising:
providing a multiplexer having a plurality of data inputs, a plurality of select inputs, and an output;
providing a plurality of data input flip-flops coupled to the data inputs of the multiplexer;
providing a plurality of select input flip-flops coupled to the select inputs of the multiplexer;
providing a synchronizing circuit coupled to the output of the multiplexer and providing an output of a serial encoder, wherein the synchronizing circuit comprises a final data register stage, and the final data register stage is separated by a single logic layer from the output of the serial encoder, thereby resulting in a low output skew of the encoder; and
employing the synchronizing circuit to substantially eliminate output glitches from the output of the multiplexer.

34. The method of claim 33 further comprising employing a counter to provide the select inputs of the multiplexer according to a clock signal.

35. The. method of claim 34 further comprising employing the multiplexer to output a bit at an edge of the clock signal.

36. The method of claim 33, wherein the final data register stage is clock-driven.

37. The method of claim 33, wherein the synchronizing circuit is implemented using a dual edge flip-flop.

38. The method of claim 33, wherein the encoder receives a parallel data input and serially outputs the data input onto a serial communications link.

39. A method of serial encoding, comprising:
providing a multiplexer having a plurality of data inputs, a plurality of select inputs, and an output;
providing a plurality of data input flip-flops coupled to the data inputs of the multiplexer;
providing a plurality of select input flip-flops coupled to the select inputs of the multiplexer;
providing a synchronizing circuit coupled to the output of the multiplexer and providing an output of a serial encoder, wherein the synchronizing circuit comprises a final data register stage and wherein the output of the serial encoder is solely determined by two signals from the final data register stage of the synchronizing circuit, thereby resulting in a low output skew of the encoder; and
employing the synchronizing circuit to substantially eliminates output glitches from the output of the multiplexer.

40. The method of claim 39 further comprising employing a counter to provide select inputs of the multiplexer according to a clock signal.

41. The method of claim 39, wherein the final data register stage is clock-driven.

42. The method of claim 39, wherein the encoder receives a parallel data input and serially outputs the data input onto a serial communications link.

* * * * *